(12) United States Patent
Farnworth et al.

(10) Patent No.: US 6,562,278 B1
(45) Date of Patent: May 13, 2003

(54) METHODS OF FABRICATING HOUSING STRUCTURES AND MICROMACHINES INCORPORATING SUCH STRUCTURES

(75) Inventors: Warren M. Farnworth, Nampa, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 09/651,863

(22) Filed: Aug. 29, 2000

(51) Int. Cl.$^7$ .................. B29C 35/08; B29C 41/20; B29C 70/88
(52) U.S. Cl. ............. 264/401; 264/242; 264/272.11; 264/272.14; 264/272.17; 264/272.19; 264/272.2; 264/279; 264/279.1; 264/308
(58) Field of Search ........................ 264/242, 272.11, 264/272.14, 272.17, 272.19, 272.2, 279, 279.1, 308, 401

(56) References Cited

U.S. PATENT DOCUMENTS

| | | | |
|---|---|---|---|
| 4,527,119 A | | 7/1985 | Rogers et al. |
| 4,655,534 A | | 4/1987 | Stursa |
| 5,038,062 A | | 8/1991 | Shiraki |
| 5,165,289 A | | 11/1992 | Tilmans |
| 5,173,220 A | * | 12/1992 | Reiff et al. .................. 264/401 |
| 5,264,061 A | * | 11/1993 | Juskey et al. ........... 264/401 X |
| 5,484,314 A | | 1/1996 | Farnworth |
| 5,705,117 A | * | 1/1998 | O'Connor et al. .......... 264/401 |
| 5,805,375 A | | 9/1998 | Fan et al. |

* cited by examiner

Primary Examiner—Leo B. Tentoni
(74) Attorney, Agent, or Firm—TraskBritt

(57) ABSTRACT

A method for producing a monolithic, seamless, polymeric housing structure for a micromachine uses a stereolithographic method to produce the structure layer by layer by exposing sequentially formed films of photopolymer to a beam of electromagnetic radiation scanned over patterns of locations corresponding to at least partially superimposed layers of the housing structure. The housing structure may include openings through which movable elements such as shafts and linkages may extend, and may provide sealed passage for electrical conductors therethrough from the micromachine to the exterior of the housing structure. Complex housing structures including closed or almost closed chambers and interior partition walls as well as interior passages of complex configuration may be formed to accommodate individual components or component assemblies. The micromachine may be assembled during fabrication of the housing structure, and preformed components or assemblies placed into the partially formed housing structure and the housing structure subsequently completed.

30 Claims, 24 Drawing Sheets

METHODS OF FABRICATING HOUSING STRUCTURES AND MICROMACHINES INCORPORATING SUCH STRUCTURES

BACKGROUND OF THE INVENTION

1. Field of the Invention

The present invention relates generally to stereolithography and, more specifically, to the use of stereolithography in forming multicomponent mechanical and electro mechanical structures including seamless packaging or encapsulation.

2. State of the Art

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually being effected with 3D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed or a separate binder material which may be employed to bond material particles to one another and to those of a previously-formed layer. In some instances, thin sheets of material may be superimposed to build an object, each sheet being fixed to a next-lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer which can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material may be disposed might be rapidly generated. Prototypes of objects may be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventors' knowledge, stereolithography has yet to be applied to mass production of tiny articles in volumes of thousands or millions, where the article comprises a micromachine housing/support structure ordinarily requiring assembly of separate parts with associated intermediate seams, gaskets, and other sealing elements, and where extremely high resolution and a high degree of reproducibility of results is required.

The continuing race toward increased miniaturization in the electronic industry is well known, particularly in the manufacture of semiconductor devices. Technology relating to a parallel miniaturization of peripheral electronic equipment has not been developing at the same rate. Thus, for example, while the density of memory devices has greatly increased, making very small memory devices such as memory disks possible, the development of reliable read/write equipment for such memory devices is lagging.

A recently developed type of read/write drive system has been called a "wobble-motor-microactuator," several forms of which are described in U.S. Pat. No. 5,093,594 of Mehregany and U.S. Pat. No. 5,805,375 of Fan et al. One of the difficulties with micromachines is that because of their moving parts and very low power, they are sensitive to any moisture or dust particle and require some sort of protection, particularly when mounted on a circuit board or other substrate material. An object of the present invention is to present a process for forming an effective protective/support structure for a micromachine, which protective/support structure is inexpensive to produce, may be repeatably produced with precision in large batches, and is adaptable to a wide variety of micromachine configurations and sizes.

BRIEF SUMMARY OF THE INVENTION

The present invention provides a method for fabricating micromachines using a stereolithographic (STL) structure-forming technique to form a housing of consecutively polymerized layers. The first layer is formed on a workpiece support substrate or platform and each subsequent layer formed atop the previous layer. A monolithic housing and support for a machine may be rapidly and precisely formed, wherein preformed machine components such as rotating shafts, actuators, electrical leads, etc. are accurately placed within or through the housing walls. The housing may be formed to be absolutely seamless and imperforate, except for machine elements or openings extending through one or more walls of the housing. The housing is a single part or unitary structure, unlike conventional-multiple-part micromachine housings. The housing may include interior machine supports, dividing walls and partitions, shelves, and the like, as will best serve the design and purpose of the micromachine. The housing structure may include elements of planar and/or curved configuration.

The present invention employs computer-controlled, 3D CAD initiated, stereolithographic techniques to form housing/support structures for miniaturized machine assemblies commonly termed "micromachines" such as, for example, controller micromotors, gearboxes, and the like, such micromachines having overall exterior dimensions on the order of, for example and not by way of limitation, about 5–100 mm. The stereolithographic apparatus may be configured for production of one or more, or even a large number of such micromachines during each STL operation.

The present method preferably includes the use of machine vision to precisely place micromachine components within housing/supports as they are formed, and precisely form the features of the housing/supports, e.g., partitions, shaft holes, bearings, contact surfaces, shelves, projections, etc., to support and house the micromachine components or assemblies of same within a seamless structure.

In a preferred embodiment, an exterior housing/support structure for a micromachine in accordance with the invention is fabricated using precisely focused electromagnetic radiation in the form of an ultraviolet (UV) wavelength laser under control of a computer and responsive to input from a machine vision system such as a pattern recognition system to fix or cure a liquid material in the form of a photopolymer.

DETAILED DESCRIPTION OF THE INVENTION

Figure 1:
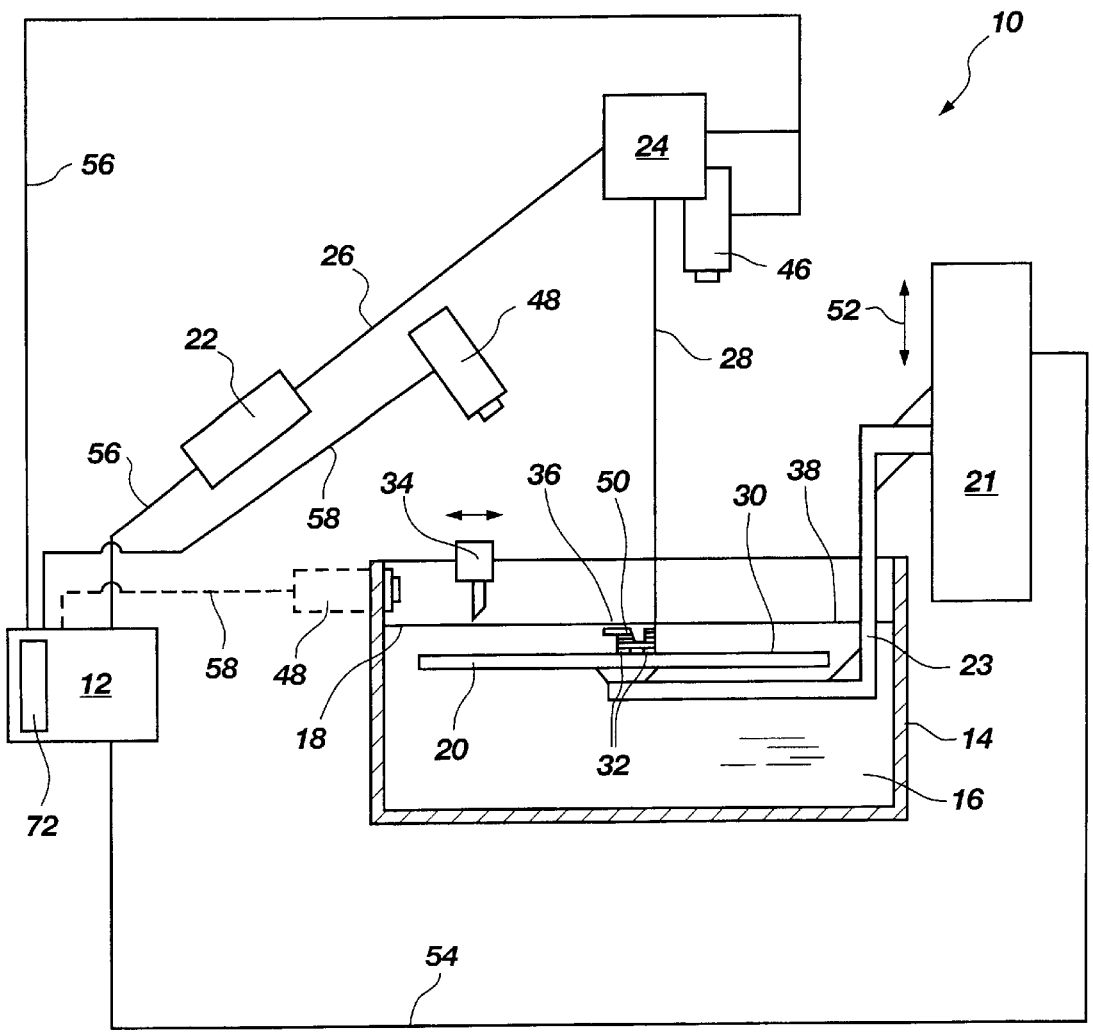
FIG. 1 is a schematic side elevation of an exemplary stereolithography apparatus suitable for use in practicing the method of the present invention.

FIG. 1 depicts schematically various components, and operation, of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus for implementation of the present invention as well as operation of such apparatus are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836.

The disclosure of each of the foregoing patents is hereby incorporated herein by this reference. As noted in more detail below, although a conventional stereolithography apparatus may be utilized, a preferred embodiment of the invention utilizes a stereolithography apparatus such as, for example, of the type offered by 3D Systems, Inc., modified to employ a so-called "machine vision" system in combination with suitable programming of the computer controlling the stereolithographic process, to eliminate the need for accurate positioning or mechanical alignment of workpieces to which material is stereolithographically applied. Use of these features expands the use of conventional stereolithographic apparatus and methods to application of materials to large numbers of workpieces which may differ in orientation, size, shape, dimension, and purpose. This improvement to the basic stereolithographic apparatus is described in U.S. patent application Ser. No. 09/259,142, filed Feb. 26, 1999 and assigned to the assignee of the present invention, the disclosure of such patent application being hereby incorporated herein by reference.

While the preformed micromachine workpiece components employed in the practice of the preferred embodiment of the method of the invention are, by way of example only, those of micromotors and micromotor controller assemblies, the method and apparatus of the invention are applicable to fabrication of other micromachine products wherein adaptability for rapidly fabricating large numbers of components into micromachine assemblies having the aforementioned variations in orientation, size, shape, dimension and purpose is desired.

This application pertains to housings and supports for micromachines, the definition of which is as generally used in the industry, i.e., devices of very small size having moving parts. As noted above, the overall dimensions of a micromachine are typically in the range of about 5–100 mm, with much smaller micromachines under development. Micromachines typically include a motor with a drive assembly to effect motion of some element, although the present invention is not so limited.

With reference again to FIGS. 1 and 2, a 3D CAD drawing of a micromachine 40 (see FIG. 6) to be supported and enclosed in a supportive object 50 defining a housing for micromachine 40 is prepared in the form of a data file. The data file is placed in memory of a computer 12. The computer 12 controls the operation of stereolithography apparatus 10, and may be a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for controlling fabrication of the object 50.

The data defining the object 50 is preferably formatted in an "STL" (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 10 also includes a reservoir 14 (which may comprise a removable reservoir interchangeable with others containing different materials) of liquid material 16 to be employed in fabricating the intended object. In the currently preferred embodiment, the liquid material 16 is a photocurable polymer responsive to light in the UV wavelength range. The surface level 18 of the liquid material 16 is automatically maintained at an extremely precise, constant magnitude by devices known in the art responsive to output of sensors within apparatus 10 and preferably under control of computer 12. A support platform or elevator 20 is attached by a platform arm 23 to a platform actuator 21, which vertically moves and positions the support platform 20 as indicated by arrows 52 in precise, fine, repeatable increments responsive as indicated at 54 to control of computer 12. The support platform 20 is located for movement downwardly into and upwardly out of liquid material 16 in reservoir 14.

A UV wavelength range laser plus associated optics and galvanometers (collectively identified as 22) for controlling the scan of laser beam 26 in the X-Y plane across platform 20 has associated therewith mirror 24 to reflect laser beam 26 downwardly as laser beam 28 toward surface 30 of platform 20. Laser beam 28 is traversed in a selected pattern in the X-Y plane, that is to say, in a plane parallel to surface 30, by initiation of the galvanometers under control of computer 12 to at least partially cure, by impingement thereon, selected portions of liquid material 16 disposed over surface 30 to at least a semisolid state. The use of mirror 24 lengthens the path of the laser beam 26/28, effectively doubling same, and provides a more vertical beam 28 than would be possible if the range laser 22 itself was mounted directly above platform surface 30, thus enhancing resolution.

Data from the STL files resident in memory of computer 12 is manipulated to build an object 50 one layer 60 at a time. Accordingly, the data mathematically representing object 50 is divided into subsets, each subset representing a slice or layer 60 of object 50. This is effected by mathematically sectioning the 3D CAD model into a plurality of horizontal layers 60, a "stack" of such layers representing object 50. Each slice or layer 60 may be from about 0.0001 to about 0.03 inch thick. As mentioned previously, a thinner slice 60 promotes higher resolution by enabling better reproduction of fine vertical surface features of object 50. In some instances, a base support or supports 32 for an object 50 may also be programmed as a separate STL file, such supports 32 being fabricated before the overlying object 50 in the same manner. The use of base supports 32 facilitates fabrication of an object 50 with reference to a perfectly horizontal plane and subsequent removal of object 50 from the surface 30 of support platform 20. Where a "recoater" blade 34 is employed as described below, the interposition of base supports 32 precludes inadvertent contact of blade 34 with surface 30.

Before fabrication of object 50 is initiated with apparatus 10, the primary STL file for object 50 and the file for base support(s) 32 are merged. It should be recognized that, while reference has been made to a single object 50, multiple objects may be concurrently fabricated on surface 30 of platform 20. In such an instance, the STL files for the various objects and supports, if any, are merged. The objects 50 may differ in dimension and shape. Operational parameters for apparatus 10 are then set, for example, to adjust the size (diameter 29, if circular) of the laser beam 28 used to cure liquid material 16. The laser beam 28 may have any cross-sectional shape, and its dimension(s) determine the smallest feature which may be formed.

Before initiation of a first layer for a support 32 or object 50 is commenced, computer 12 automatically checks and, if necessary, adjusts by means known in the art as referenced above, the surface level 18 of liquid material 16 in reservoir 14 to maintain same at an appropriate focal length for laser beam 28. U.S. Pat. No. 5,174,931, referenced above and previously incorporated herein by reference, discloses one suitable level control system. Alternatively, the height of mirror 24 may be adjusted responsive to a detected surface level 18 to cause the focal point of laser beam 28 to be located precisely at the surface of liquid material 16 at surface level 18 if surface level 18 is permitted to vary, although this approach is somewhat more complex. The platform 20 may then be submerged in liquid material 16 in reservoir 14 to a depth greater than the thickness of one layer or slice 60 of the object 50, then raised to a depth equal to the thickness of a layer 60, and the liquid surface level 18 readjusted as required to accommodate liquid material 16 displaced by submergence of platform 20. Laser 22 is then activated so that laser beam 28 will scan liquid material 16 over selective portions of surface 30. The laser irradiated areas of the thin layer of liquid material 16 overlying platform 20 are at least partially cured (e.g., at least partially polymerized) by the laser radiation, defining the boundaries of a first layer 60 (of object 50 or support 32, as the case may be) and filling in solid portions thereof. Platform 20 is then lowered by a distance equal to the thickness of a layer 60, and the laser beam 28 scanned to define and fill in the second layer 60 while simultaneously bonding the second layer to the first. The process is then repeated, layer by layer, until object 50 is completed.

If a recoater blade 34 is employed, the process sequence is somewhat different. In this instance, the surface 30 of platform 20 is lowered into liquid material 16 below surface level 18, then raised thereabove until it is precisely one layer's thickness below blade 34. Blade 34 then sweeps horizontally over surface 30, or (to save time) at least over a portion thereof on which object 50 is to be fabricated, to remove excess liquid material 16 and leave a film 36 thereof of the precise, desired thickness 42 on surface 30. Platform 20 is then lowered so that the surface 38 of the film 36 and surface level 18 are coplanar and the surface 38 of the film 36 is still. Laser 22 is then initiated to scan with laser beam 28 and define a first layer which will be designated herein as 60A. The process is repeated, layer by layer, to define each succeeding layer 60 and simultaneously bond same to the adjacent lower layer 60 until base support 32 and object 50 are completed. In this discussion, the addition of upper case letters will be used to distinguish successive layers 60. A more detailed discussion of this sequence and apparatus for performing same is disclosed in U.S. Pat. No. 5,174,931, previously incorporated herein by reference.

Figure 2:
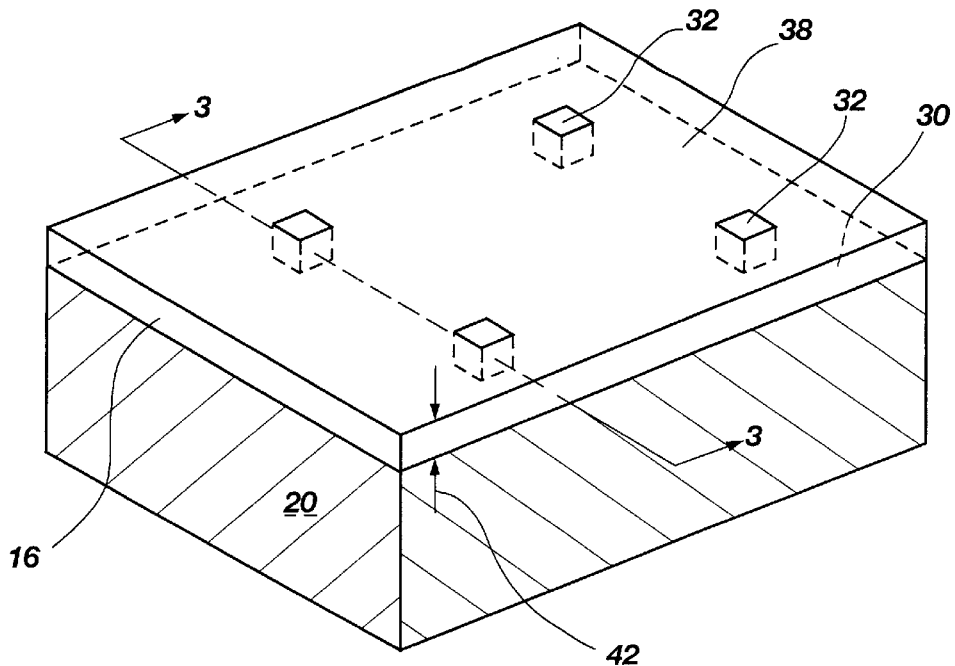
FIG. 2 is an upper isometric view of a portion of a support platform of a stereolithography apparatus showing the formation of a hypothetical micromachine housing/support structure in accordance with the invention.
Figure 3:
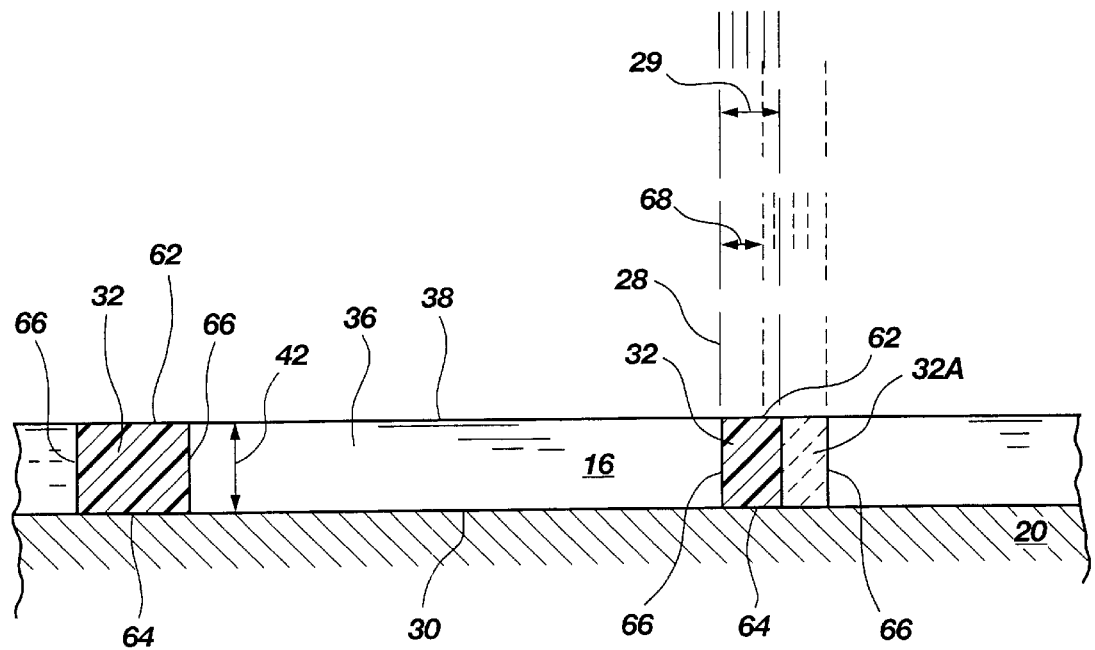
FIG. 3 is a cross-sectional side view of a portion of a support platform of a stereolithography apparatus showing the formation of a housing/support structure for a hypothetical micromachine in accordance with the invention, as taken along line 3—3 of FIG. 2.

As shown in FIGS. 2 and 3, exemplary base supports 32 are fabricated on the upper surface 30 of support platform 20 by forming a film 36 of liquid photopolymer material 16, as described above. The film 36 has a surface 38 and a thickness 42 between film surface 38 and platform surface 30. The boundaries of the base supports 32 are indicated as including an upper surface 62, lower surface 64, and lateral surfaces 66. A substantially vertical laser beam 28 is shown as having a cross-sectional circular diameter 29. Photopolymer liquid material 16 in film 36 cures to at least a semisolid state as it is exposed to the laser beam 28. The laser beam 28 is shown as scanning in direction 68 to complete radiation of the entire horizontal area defined within the boundaries of surfaces 62, 64 and 66, including subregion 32A to complete base support 32. Formation of the base supports 32 in this manner bonds the photopolymer to the platform surface 30, and the base supports 32 may be subsequently cut to release the completed object 50 from the platform 20. Alternatively, a release agent may be first applied to the support platform 20 to enable release under a controlled low force.

Figure 4:
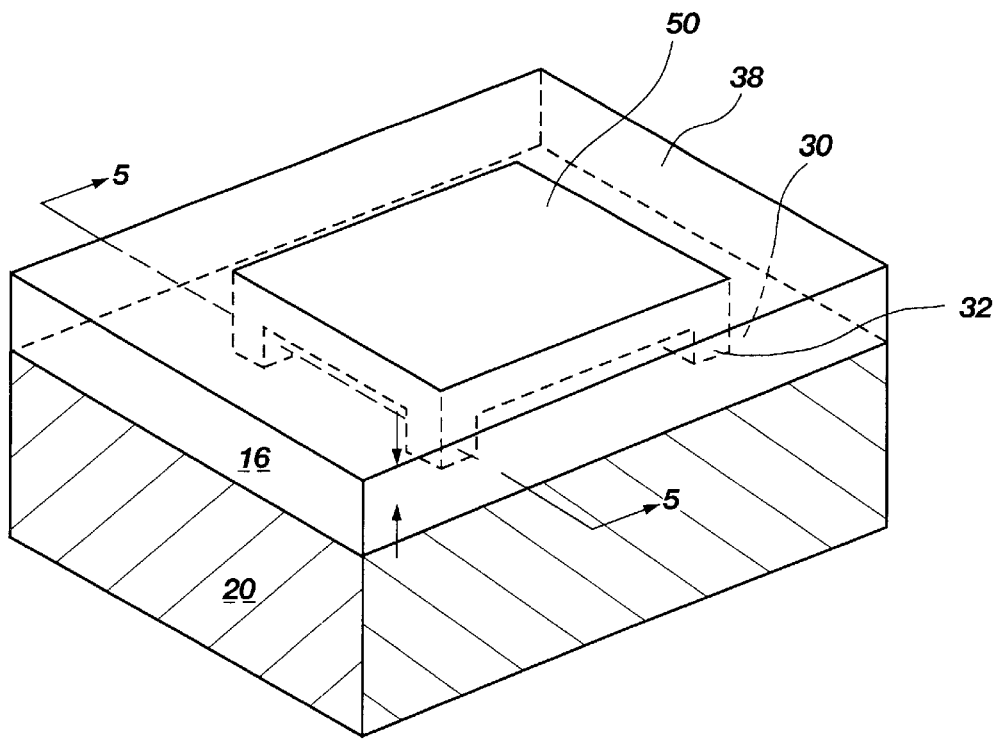
FIG. 4 is an upper isometric view of a portion of a support platform of a stereolithography apparatus showing a further step in the formation of a hypothetical micromachine housing/support structure in accordance with the invention.
Figure 5:
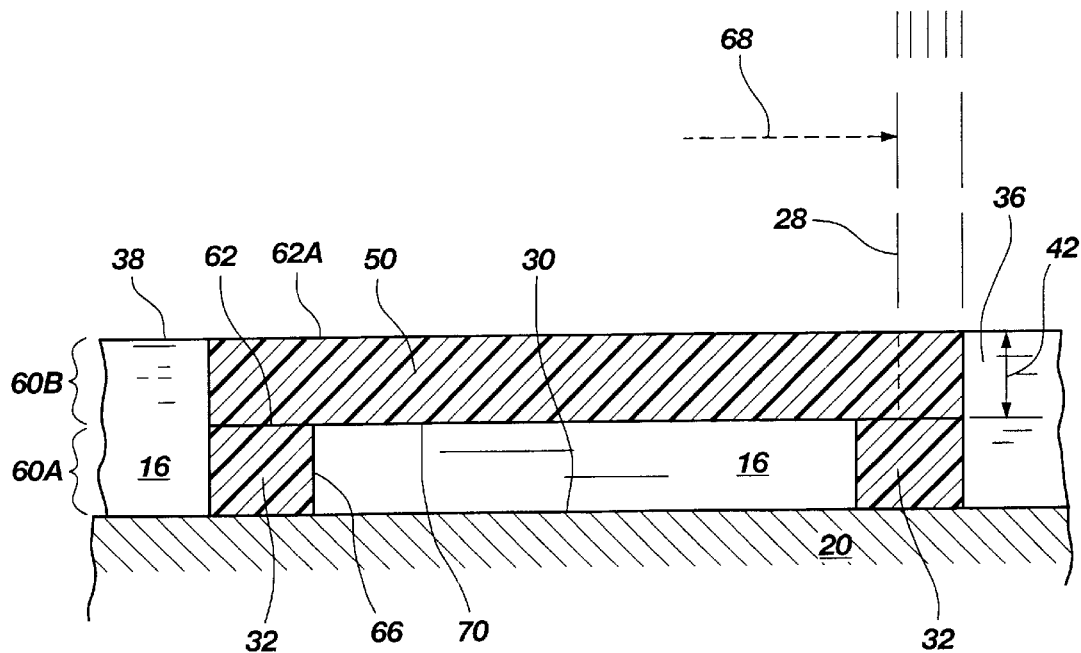
FIG. 5 is a cross-sectional side view of a portion of a support platform of a stereolithography apparatus showing a further step in the formation of a housing/support structure for a hypothetical micromachine in accordance with the invention, as taken along line 5—5 of FIG. 4.

Formation of a second layer 60B is depicted in FIGS. 4 and 5, wherein the liquid surface level 18 and/or platform 20 is first vertically adjusted to form a film 36 of liquid photopolymer atop the first layer 60A. The film thickness is accurately controlled by computer 12. By scanning the laser beam 28 under the control of the computer 12, a second layer 60B of cured photopolymer is formed atop the first layer 60A, and comprises the base (or a first layer) of a finished object 50 such as a micromachine housing/support structure. Much of the second layer 60B is shown as being suspended over liquid photopolymer material 16. The second layer 60B may be formed, for example, by first exposing portions of film 36 overlying the base supports 32, and then scanning outwardly therefrom to form an expanding cantilevered structure. Where it is important to form a very precise lower surface 70 of a cantilevered structure, the film thickness 42 may be reduced, with concurrent reduced laser exposure. Optionally, several passes at reduced laser exposure may be performed, inasmuch as a slight time delay exists between exposure and cross-polymerization. While the separate layers 60 of the object 50 are shown in FIG. 5 with separating lines or seams, in actuality abutting layers 60 are bonded and cure into a seamless, monolithic object.

Generally, the surface area of the photopolymer to be exposed to the laser beam 28 to form a layer 60 is greater than the beam circular diameter 29. Thus, each layer 60 of an object 50 is preferably built by first defining any internal and external object boundaries (e.g. lateral surfaces 66) of that layer 60 by scanning with laser beam 28, then hatching intermediate areas of object 50 with the laser beam. If a particular part of a particular layer 60 is to form a boundary of a void in the object 50 above or below that layer 60, then the laser beam 28 may be scanned in a series of closely-spaced, parallel vectors so as to develop a continuous surface, or skin 70, with improved strength and resolution. The time it takes to form each layer 60 depends upon its geometry, surface tension, reactivity and viscosity of liquid material 16, laser beam intensity, and thickness 42 of the layer.

Figure 6:
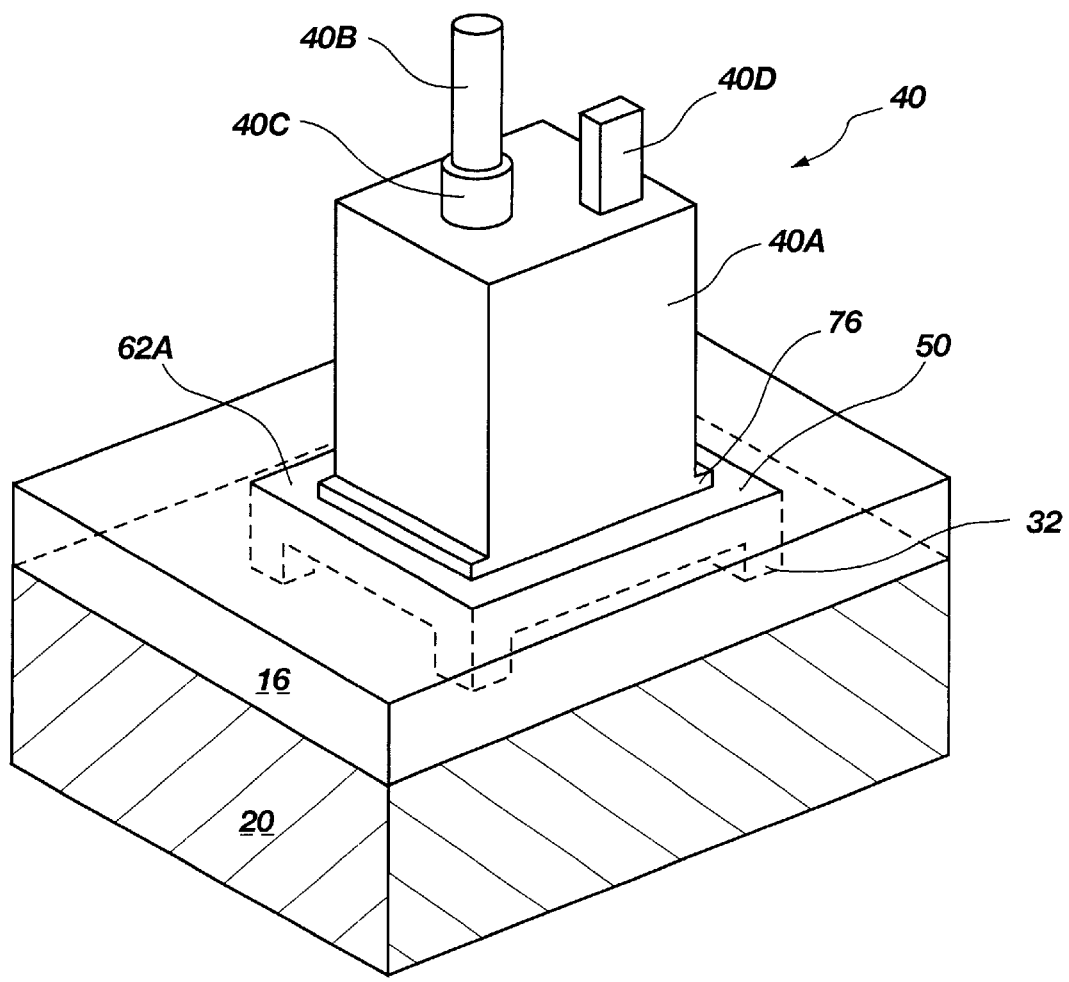
FIG. 6 is an upper isometric view of a partially completed housing/support structure showing placement of a micromachine thereon in accordance with the invention.

As depicted in FIG. 6, a hypothetical micromachine 40 shown with a sealed body portion 40A has a movable shaft 40B extending outwardly through a bearing 40C, and electrical conduit 40D extending from the body portion. The micromachine 40 is shown by way of example to optionally include mounting flanges 76. The micromachine 40 is positioned on the upper surface 62A of the incompleted object 50. The micromachine 40 is placed on the object 50 either manually or by a computer-controlled robot, not shown. Robotic placement machines for very small devices are commonly used in the electronics industry, and such "pick and place" equipment is currently developed to a high degree of sophistication.

Figure 7:
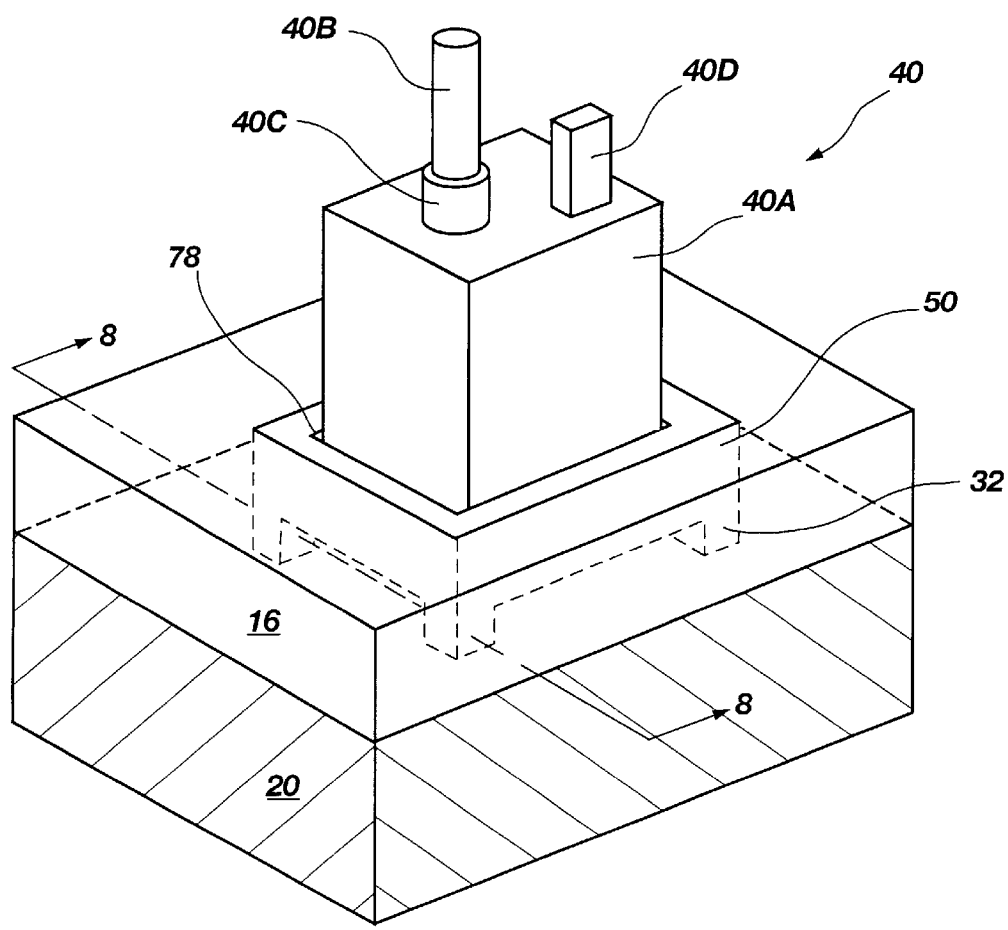
FIG. 7 is an upper isometric view of a further step in forming a housing/support structure about a micromachine in accordance with the invention.
Figure 8:
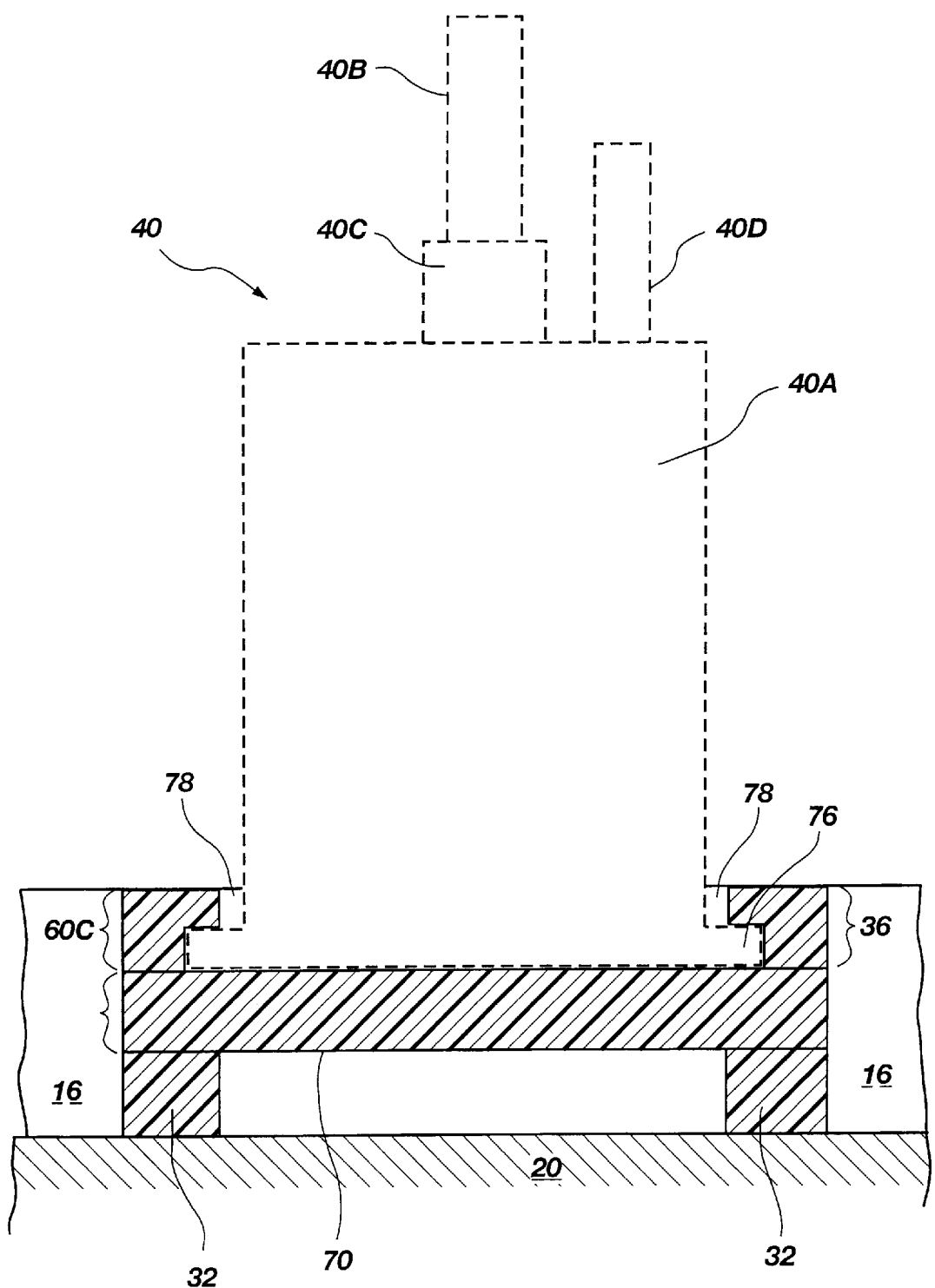
FIG. 8 is a cross-sectional side view of a further step in forming a housing/support structure about a micromachine in accordance with the invention, as taken along line 8—8 of FIG. 7.

The level of liquid photopolymer material 16 is then raised (or the support platform lowered) to form another film 36 of photopolymer material over the prior layer 60B. In this particular example, the flanges 76 of the micromachine 40 are also covered. Scanning of the laser beam 28, not shown in FIGS. 7 and 8, over the selected portions of the film surface 38 polymerizes liquid material 16 of the film 36, forming layer 60C as an integral part of the underlying layer 60B, and enclosing flanges 76 to retain the micromachine 40 at the desired location. Thus, the object 50, comprising a micromachine housing/support structure, is erected one layer 60 at a time as a seamless monolithic body, supporting and housing the micromachine 40.

Figure 9:
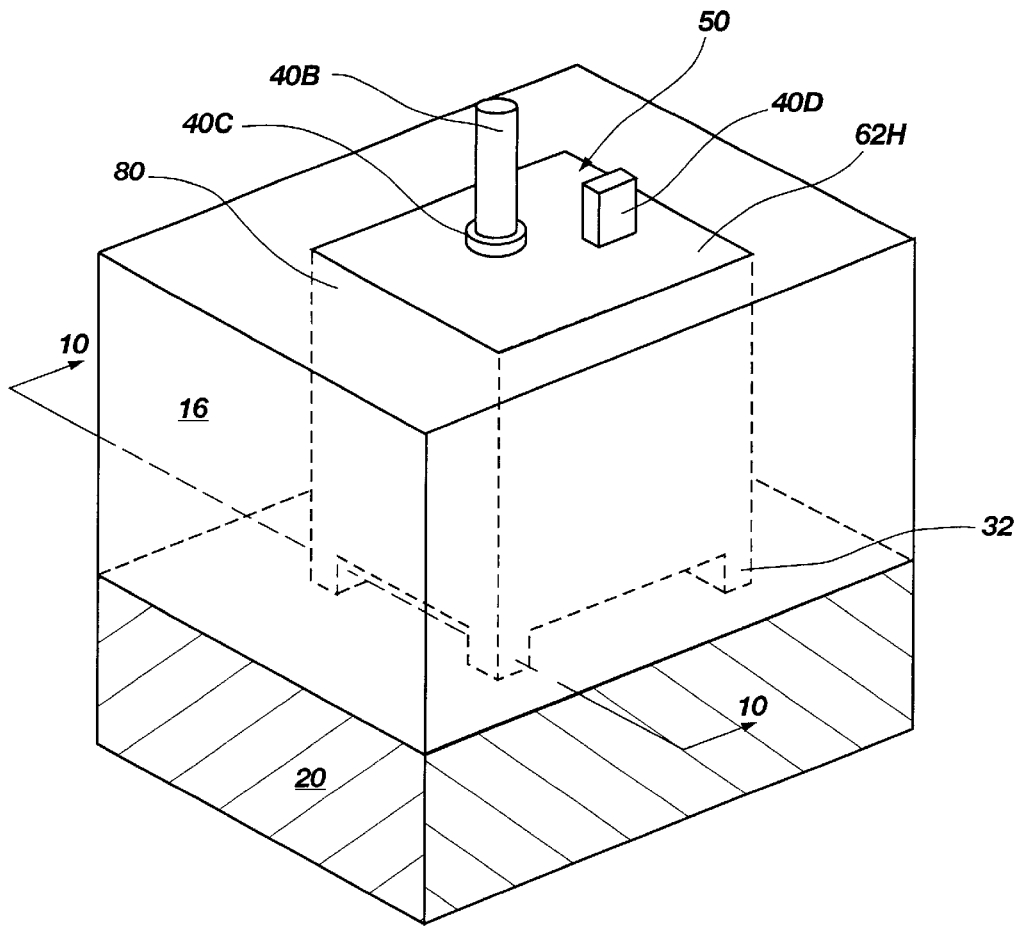
FIG. 9 is an upper isometric view of a micromachine enclosed and supported in a stereolithographically produced housing/support structure in accordance with the invention.
Figure 10:
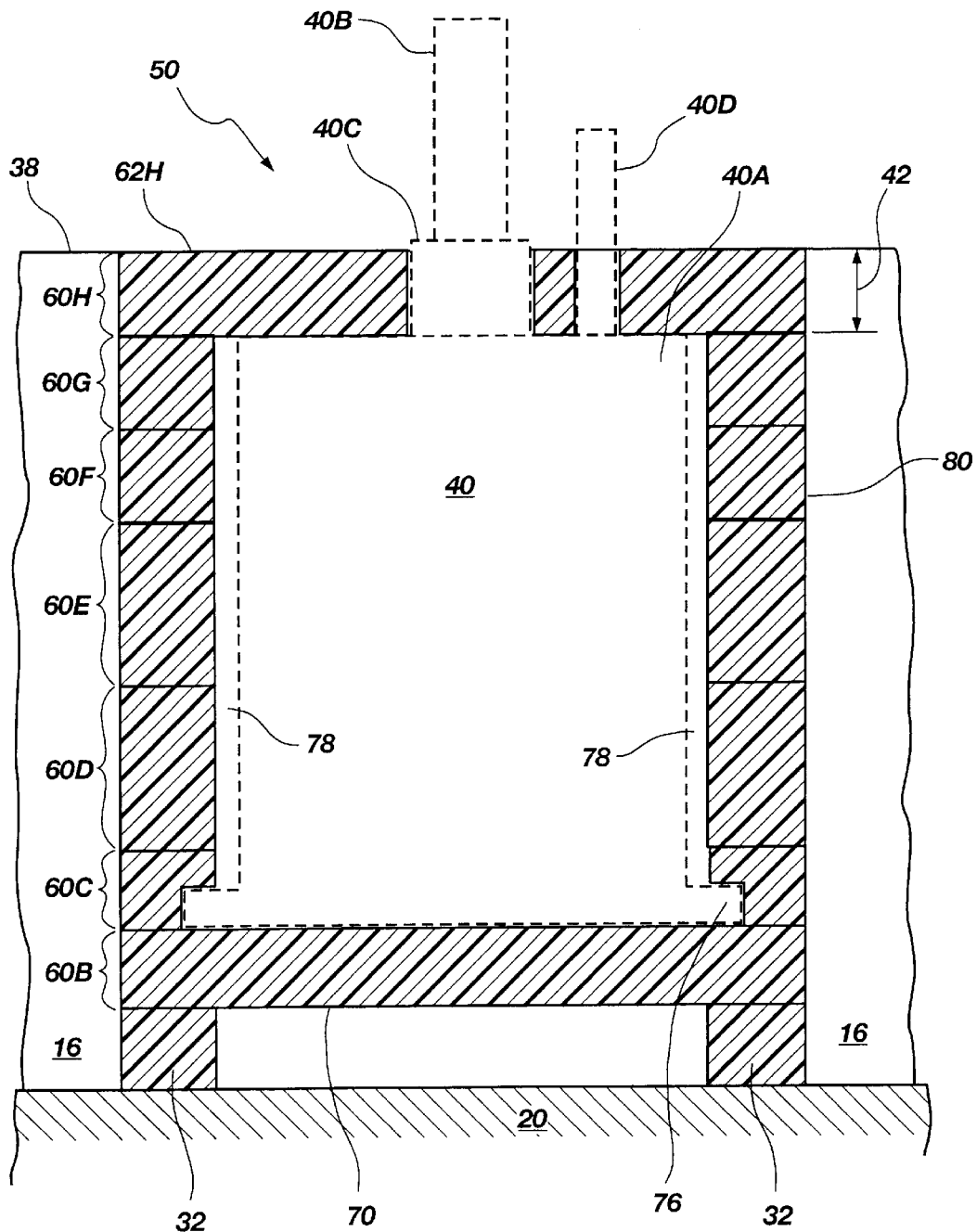
FIG. 10 is a cross-sectional side view of a micromachine enclosed and supported in a stereolithographically produced housing/support structure in accordance with the invention, as taken along line 10—10 of FIG. 9.

In FIGS. 9 and 10, the object 50 is depicted following stereolithographic formation of additional consecutive layers 60D through 60H. The object 50 comprising a housing/support structure, is shown with external wall surfaces 80, upper surface 62H, and lower surface 70. Micromachine 40 is enclosed within object 50, except for shaft 40B, the outer portion of shaft bearing 40C, and electrical conduit 40D, which project from the object 50. It is evident that the layers 60 have differing thickness 42, as already discussed. The computer program may be configured to provide an optimum design specific to the number of layers 60 as well as the depth of each layer.

It is not necessary to polymerize the entire object 50 by scanning the laser beam 28. As shown in this example (see FIG. 10), object 50 is spaced from the lateral boundaries of the micromachine 40, and this space 78 becomes filled with unpolymerized liquid material 16 during the stereolithographic process. The unpolymerized liquid material 16 becomes trapped within the structure upon completion of the upper layer, i.e., layer 60H. A subsequent thermal or UV-light treatment (i.e., a "full cure") will fully cure the partially polymerized object portions as well as the liquid material 16 trapped within the object 50.

Figure 11:
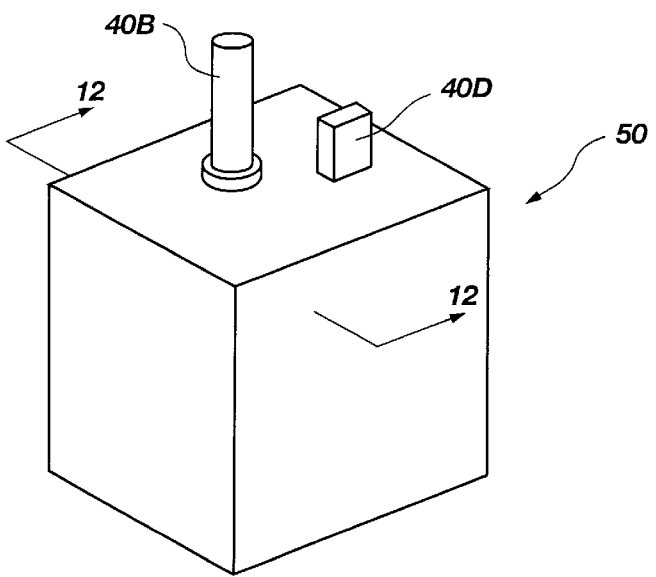
FIG. 11 is an upper isometric view of a housing/support structure enclosing a micromachine, following removal from a support platform of a stereolithography apparatus and full cure, in accordance with the invention.
Figure 12:
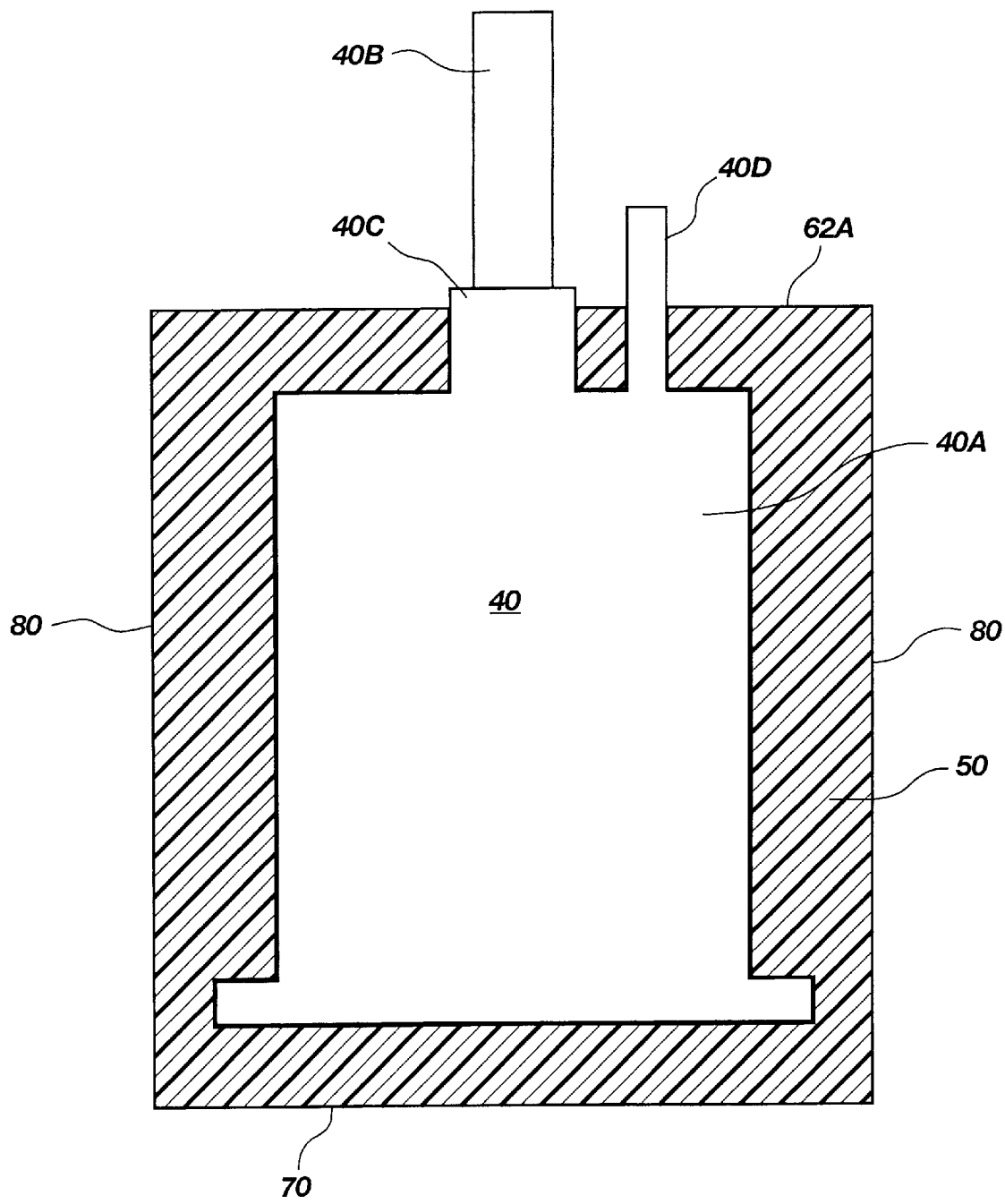
FIG. 12 is a cross-sectional side view of a housing/support structure enclosing a micromachine, following removal from a support platform of a stereolithography apparatus and full cure, in accordance with the invention, as taken along line 12—12 of FIG. 11.

Once object 50 is completed, platform 20 is elevated above surface level 18 of liquid material 16, and the platform 20 with object 50 may be removed from apparatus 10. Excess, uncured liquid material 16 on the surface of object 50 may be manually removed, and object 50 then solvent-cleaned and removed from platform 20, usually by cutting it free of base supports 32. Object 50 may then require postcuring, as liquid material 16 may be only partially polymerized and exhibit only a portion (typically 40% to 60%) of its fully cured strength. Pockets of unpolymerized liquid material 16 may be trapped within the structure. Postcuring to completely harden object 50 may be effected in another apparatus projecting UV radiation in a continuous manner over object 50 and/or by thermal completion of the initial, UV-initiated partial cure. The completed object 50, housing, and support for the hypothetical micromachine 40 is depicted in FIGS. 11 and 12. The micromachine 40 is tightly enclosed within a housing/support structure 50 which provides seals about the shaft bearing 40C and the electrical conduit 40D. The object 50 is monolithic, with continuous wall surfaces 80, upper surface 62A and lower surface 70, except for portions of the micromachine 40 which project through a particular surface.

In practicing the present invention, a commercially available stereolithography apparatus operating generally in the manner as that described above with respect to apparatus 10 of FIG. 1 is preferably employed. For example and not by way of limitation, the SLA-250/50HR, SLA-5000 and SLA-7000 stereolithography systems, each offered by 3D Systems, Inc., of Valencia, Calif. are suitable for modification. Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 resin for the SLA-7000 system. All of these resins are available from Ciba Specialty Chemicals Corporation. By way of example and not limitation, the layer thickness of liquid material 16 to be formed, for purposes of the invention, may be on the order of 0.0001 to 0.02 inch, with a high degree of uniformity over a field on a surface 30 of a platform 20.

It should be noted that different material layers 60 may be of differing heights, so as to form a structure of a precise, intended total height or to provide different material thicknesses for different portions of the structure. The size of the laser beam "spot" impinging on the surface of liquid material 16 to cure same may be on the order of 0.002 inch to 008 inch. Resolution is preferably ±0.0003 inch in the X-Y plane (parallel to surface 30) over at least a 0.5 inch by 0.25 inch field from a center point, permitting a high resolution scan effectively across a 1.0 inch by 0.5 inch area. Of course, it is desirable to have substantially this high resolution across the entirety of surface 30 of platform 20 to be scanned by laser beam 28, which area may be termed the "field of exposure," such area being substantially coextensive with the vision field of a machine vision system employed in apparatus 10, as explained in more detail below. The longer and more effectively vertical the path of laser beam 26/28, the greater the achievable resolution.

Referring again to FIG. 1 of the drawings, it should be noted that apparatus 10 of the present invention includes a primary camera 46 which is in communication with computer 12 and preferably located, as shown, in close proximity to mirror 24 located above surface 30 of platform 20. Camera 46 may be any one of a number of commercially available cameras, such as capacitive-coupled discharge (CCD) cameras available from a number of vendors. Suitable circuitry 56 as required for adapting the output of camera 46 for use by computer 12 may be incorporated in a board 72 installed in computer 12, which is programmed as known in the art to respond to images generated by camera 46 and processed by board 72. Camera 46 and board 72 may together comprise a so-called "machine vision system," and specifically a "pattern recognition system" (PRS), the operation of which will be described briefly below for a better understanding of the present invention. The use of additional "secondary" cameras 48 with circuitry 58 may assist in pattern location and placement. Alternatively, a self-contained machine vision system available from a commercial vendor of such equipment may be employed. For example, such systems are available from Cognex Corporation of Natick, Mass. For example, the apparatus of the Cognex BGA Inspection Package™ or the SMD Placement Guidance Package™ may be adapted to a stereolithography apparatus, although it is believed that the MVS-8000™ product family and the Checkpoint® product line, the latter employed in combination with the Cognex PatMax™ software, may be especially suitable for this use.

To summarize the previously-described process, in order to facilitate practice of the present invention with apparatus 10, a data file representative of the size, configuration, thickness and surface topography of, for example, a particular type and design of micromachine 40 to be supported and housed, is placed in the memory of computer 12. A plurality of housing/support objects 50 may be formed on surface 30 of platform 20. The surface 30 may be covered with a release material from which the base supports 32 or object 50 may be released with minimum force, avoiding damage to the objects 50. Alternatively, a solvent may be employed to release the base supports 32 from platform 20 after the objects 50 are completed. Such release and solvent materials are known in the art. See, for example, U.S. Pat. No. 5,447,822 referenced above and previously incorporated herein by reference. Using the data file in the computer 12, the platform actuator 21, laser 22, mirror 24 and cameras 46, 48 are manipulated to stereolithographically form base supports 32 for one or more objects 50. Cameras 46 and 48 are employed to identify and locate the position and orientation of each micromachine 40 to be enclosed and supported in a housing 50. In one embodiment, a set of base supports 32 is first formed for each housing 50 by scanning the laser beam 28 over the thin film 36 of photopolymer liquid material 16 overlying the platform 20, as controlled by computer 12. It should also be noted that data files for more than one type (size, thickness, configuration, surface topography) of housing 50 may be placed in computer memory and computer 12 programmed to recognize not only housing locations and orientations, but which type of micromachine 40 is to be housed at each location on platform 20 so that liquid material 16 may be cured by laser beam 28 in the correct pattern and to the height required. Each layer of the housing 50 is formed stereolithographically to define the complete housing.

The particular liquid material 16 selected for use in producing the housings 50 may be one of the above-referenced resins from Ciba Specialty Chemical Company which is of sufficiently similar coefficient of thermal expansion (CTE), exhibits a desirable dielectric constant, is of sufficient (semiconductor grade, if required) purity, has the desired transparency to UV radiation, and has desired strength and surface properties when hardened.

It should also be noted that the top of housing 50 may be formed within a peripheral "wall" formed by first scanning the laser beam 28 about the periphery. In this instance, photopolymer liquid material 16 may be scanned by the laser beam 28 to at least partially cure liquid material 16 residing within the peripheral dam or, alternatively, to merely cure a "skin" over the top of the housing 50, the final cure of the material of the housing top being effected subsequently by broad-source UV radiation in a chamber, or by thermal cure in an oven. In this manner, an extremely thick protective housing top may be formed in minimal time within apparatus 10.

A second example of the present invention relates to a microactuator for precise positioning of a read/write head in a very small magnetic recording disk assembly. The microactuator is moved by a so-called "wobble" or "eccentric motion" micromotor 88 such as shown in U.S. Pat. No. 5,805,375 of Fan et al. and U.S. Pat. No. 5,093,594 of Mehregany. The disclosures of both of these patents are incorporated herein by reference. The wobble micromotor 88 may have an overall diameter of as little as about 5 mm.

Figure 13:
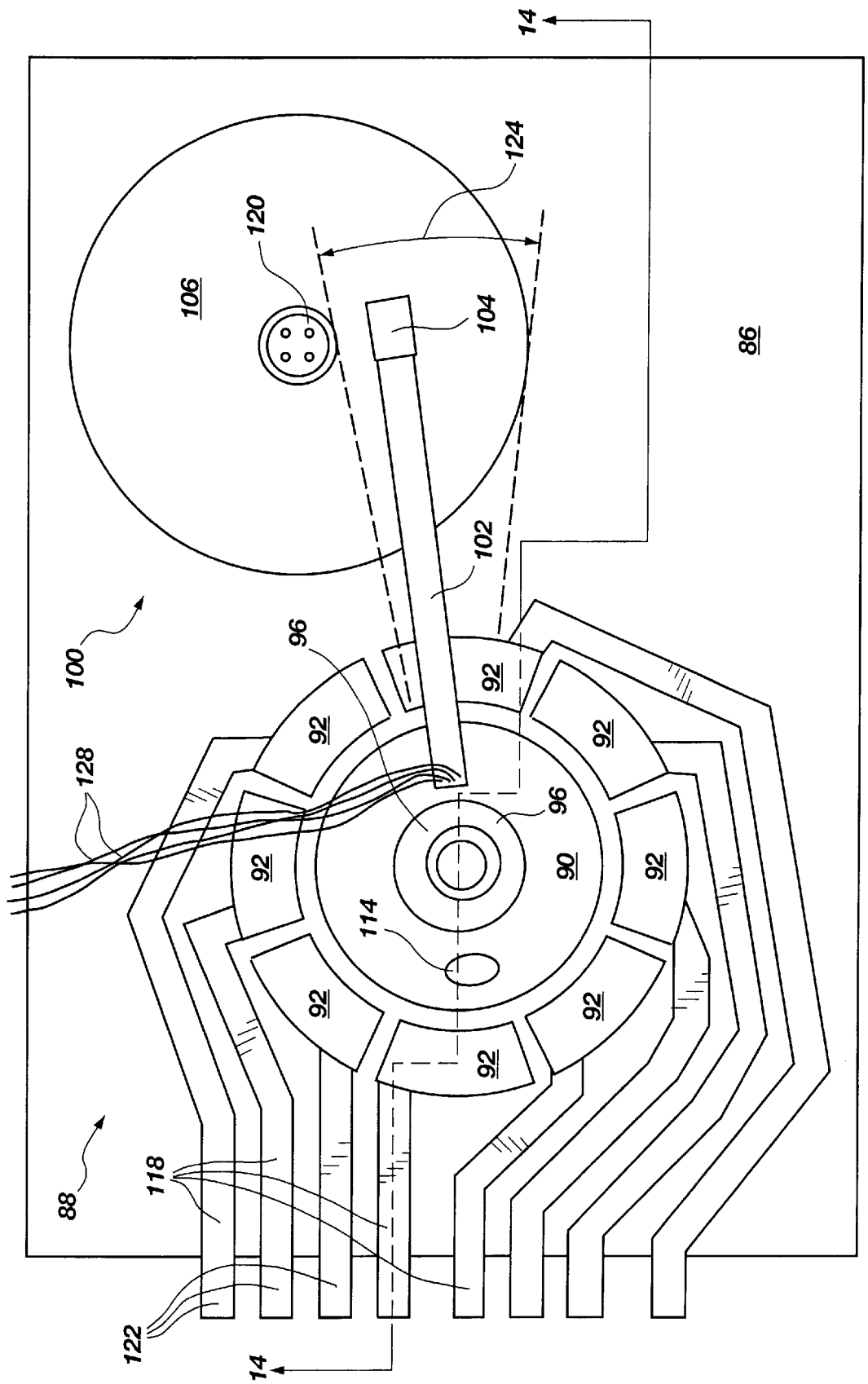
FIG. 13 is a top view of a micromachine comprising a disk drive/microactuator to be enclosed in a housing/support structure in accordance with the invention.
Figure 14:
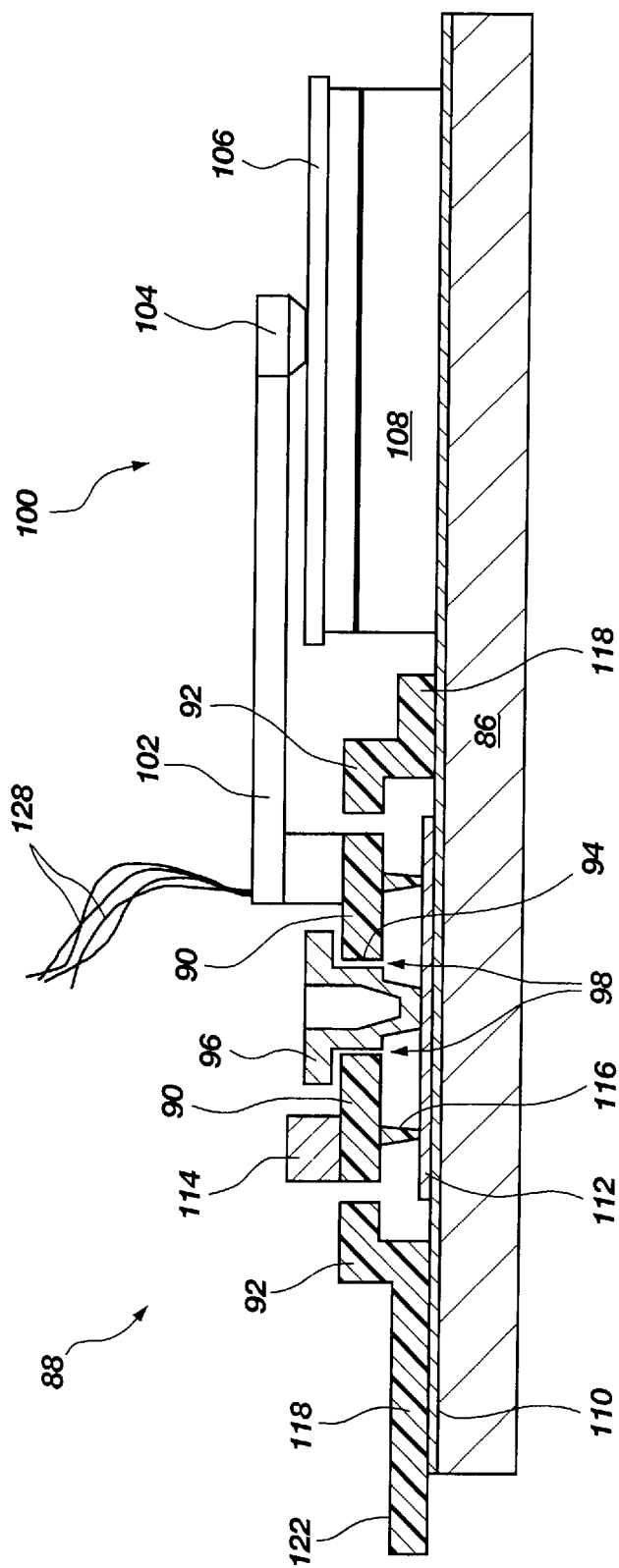
FIG. 14 is a cross-sectional side view of a micromachine comprising a disk drive/microactuator to be enclosed in a housing/support structure in accordance with the invention, as taken along line 14—14 of FIG. 13.

Referring now to FIGS. 13 and 14, a micromachine 40 comprising a disk drive assembly 100 and a microactuator head arm 102 reversibly moved by a wobble micromotor 88. A read/write head 104 is designed to ride in contact with (or very close to) a recording disk 106, the latter driven at constant speed by motor 108 through spindle 120. The wobble micromotor 88 has an annular rotor 90 surrounded by an array of stator elements 92. Within the central opening 94 of the rotor 90 is a stationary bearing 96 around which the rotor 90 rolls. Sequential electrical activation of stator elements 92 attracts the rotor 90, forcing it to rotate about the bearing 96. The gap 98 between the outer surface of the bearing 96 and the inner surface of the rotor 90 is small relative to the bearing diameter, so that the rotor 90 rotates through only a small angle with each complete cycle of stator activation. In other words, the "gear ratio" is very high. Bushings 116 extend downwardly to contact a conductive layer 112 with minimal friction.

The wobble micromotor 88 and disk drive motor 108 are mounted on a substrate 86 which may be, for example, a film of $SiO_2$ which may be coated with an insulative layer 110 such as silicon-rich nitride. Beneath the rotor 90 and stator elements 92 of the wobble micromotor 88, a conductive layer 112 such as formed of polysilicon heavily doped with phosphorus may be applied over the insulative layer 110. The entire wobble micromotor 88 is fabricated using processes, materials and tools well-known in the computer chip industry, i.e., spin-coating of thin polyimide layers, doping of silicon/silicon dioxide/polysilicon, metallizing by vapor deposition, patterning by photolithographic techniques and etching. The head arm 102 is attached to the rotor 90 so that the read/write head 104 at the end of the head arm 102 will traverse the recording disk 106. If desired, a weight 114 may be oppositely fixed to the rotor 90 to counterbalance a portion of the rotational force exerted by the head arm 102 on the rotor 90. As shown, the rotor 90 needs only to travel bidirectionally through a relatively small angle 124, which is typically less than about 30 degrees. A metallized lead 118 extends from each stator element 92 to an outer end 122, from which a connection may be made to a driver circuitry, not shown. Read/write leads 128 from read/write head 104 pass through the head arm 102 and are directed out to an amplifier, demodulator and read/write control circuits, not shown.

The present invention may be used to provide a monolithic housing/support apparatus 50 in various embodiments for the micromachine 40 comprising a micromotor and disk drive. For example, a monolithic housing/support structure 50 may enclose the wobble micromotor 88 and its leads 118. Alternatively, a structure 50 may enclose the disk drive assembly 100, with or without its leads, or the structure 50 may enclose both the wobble micromotor 88 and disk drive assembly 100 in a single housing/support structure. In further embodiments, the housing/support structure 50 encloses the wobble micromotor 88, disk drive assembly 100 and entire substrate 86. The structure 50 may be configured to have a lower level as the substrate upon which the wobble micromotor 88 and disk drive assembly 100 are mounted.

Figure 15:
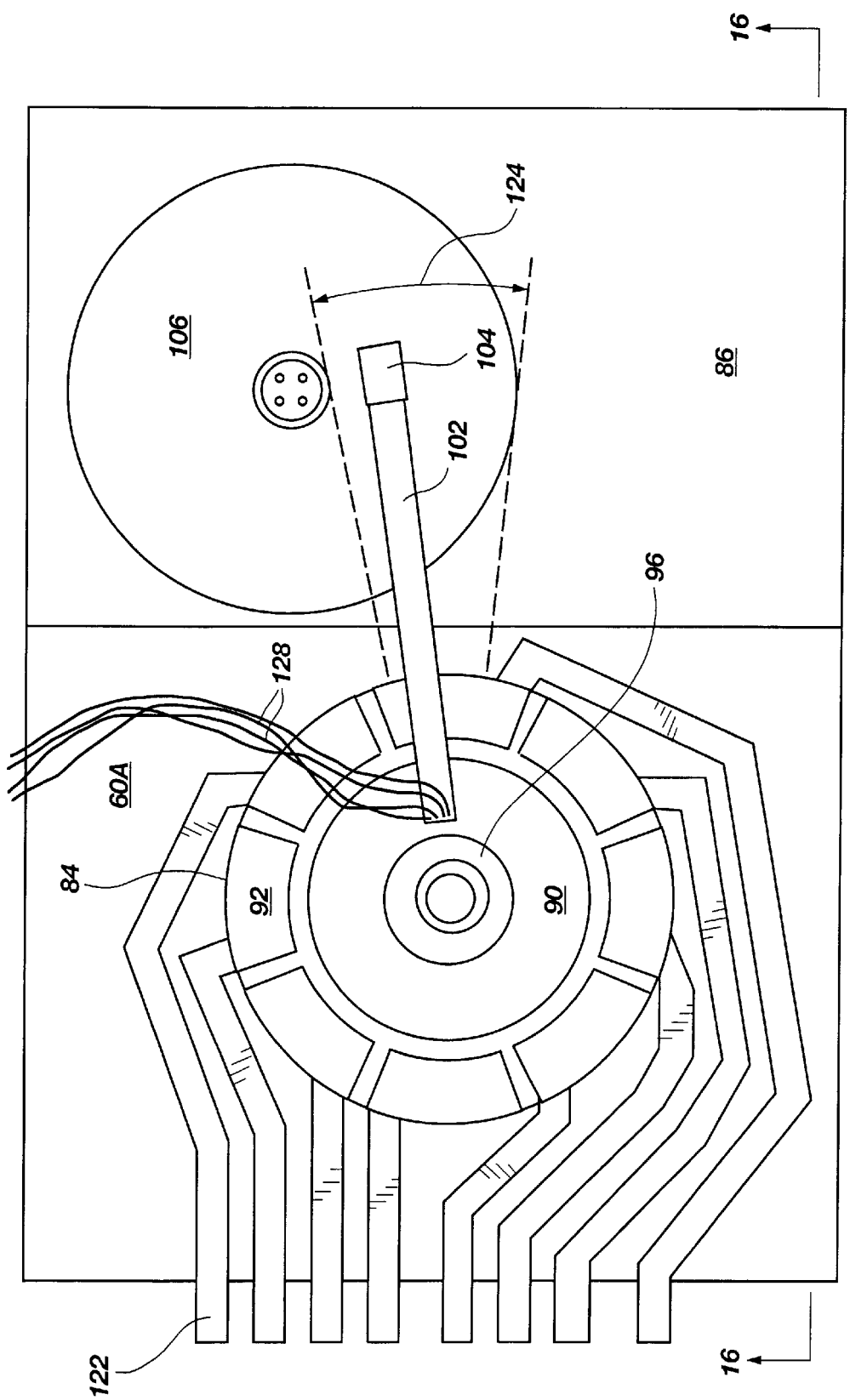
FIG. 15 is a top view of a micromachine comprising a disk drive/microactuator following stereolithographic formation of a first layer of a polymerized photopolymeric housing/support structure about a micromotor actuator in accordance with the invention.
Figure 16:
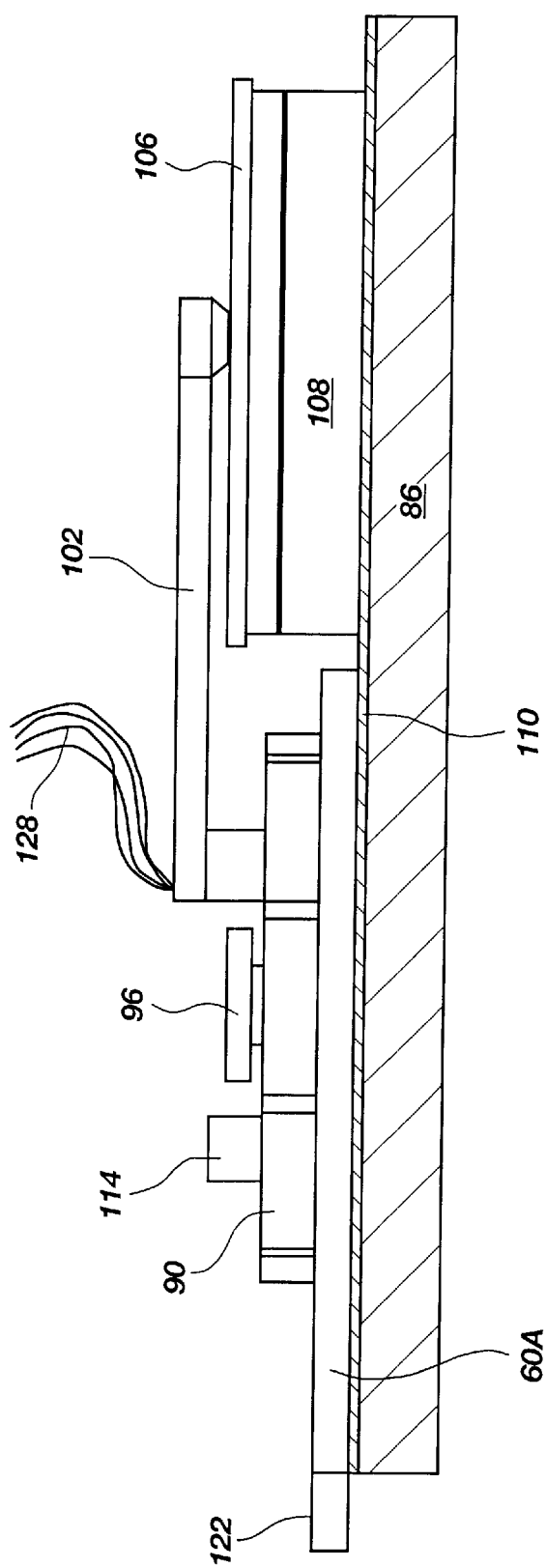
FIG. 16 is a cross-sectional side view of a micromachine comprising a disk drive/microactuator following stereolithographic formation of a first layer of a polymerized photopolymeric housing/support structure about a micromotor actuator in accordance with the invention, as taken along line 16—16 of FIG. 15.

Turning now to FIGS. 15 through 25, major steps of fabrication of a housing/support structure 50 for the wobble micromotor 88 are illustrated. As shown in FIGS. 15 and 16, a first layer 60A of at-least-partially polymerized photopolymer is formed over the insulative layer 110 of the substrate 86, surrounding the outer perimeter 84 of the stator elements 92, and filling in the interstices between the metallized leads 118. This layer 60A and subsequent layers 60B, 60C, 60D, etc. are each formed by stereolithographic polymerization with a narrow laser beam 28 under the control of computer 12 (FIG. 1), as previously described.

Figure 17:
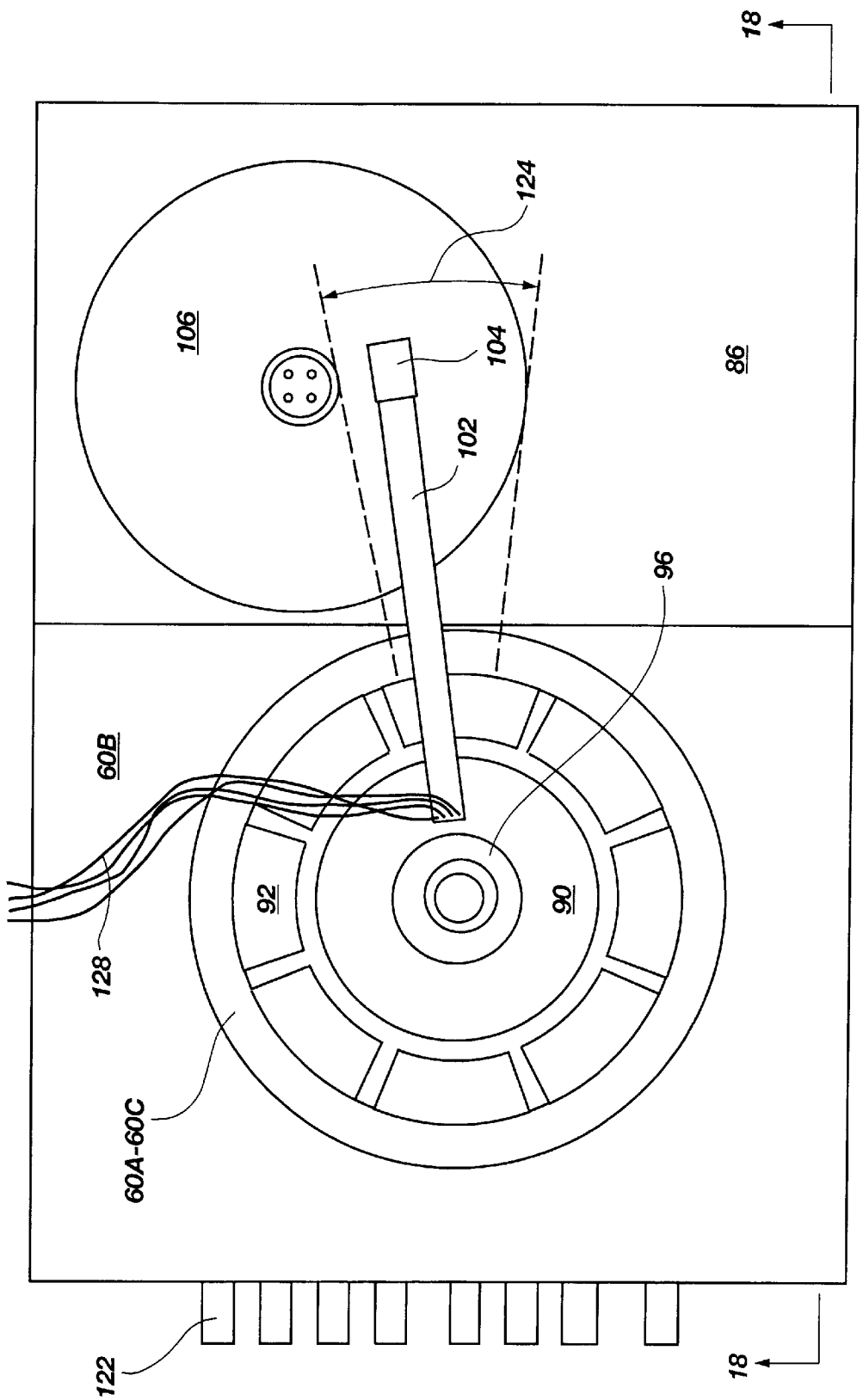
FIG. 17 is a top view of a micromachine comprising a disk drive/microactuator following stereolithographic formation of additional layers of a polymerized photopolymeric housing/support structure about a micromotor actuator in accordance with the invention.
Figure 18:
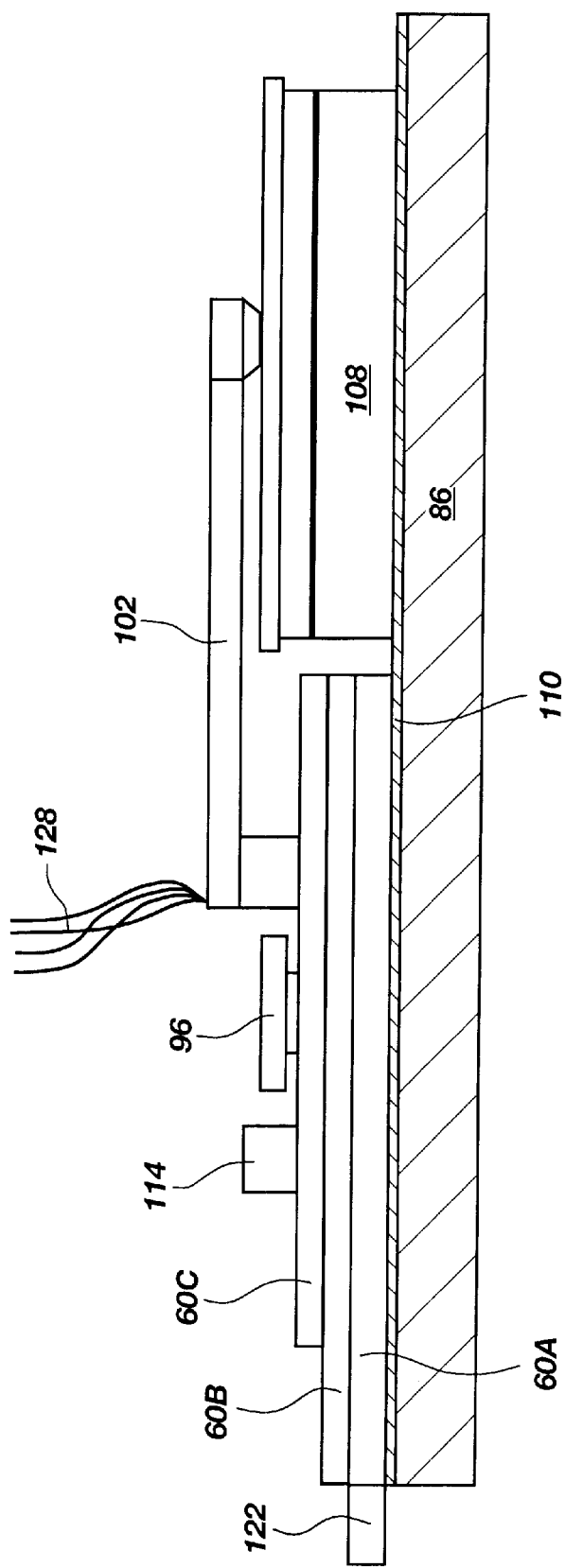
FIG. 18 is a cross-sectional side view of a micromachine comprising a disk drive/microactuator following stereolithographic formation of additional layers of a polymerized photopolymeric housing/support structure about a micromotor actuator in accordance with the invention, as taken along line 18—18 of FIG. 17.

FIGS. 17 and 18 show the formation of another layer 60B atop layer 60A, covering the metallized leads 118 for protection. Then a third layer 60C is formed in a computer-controlled pattern about the stator elements 92.

Figure 19:
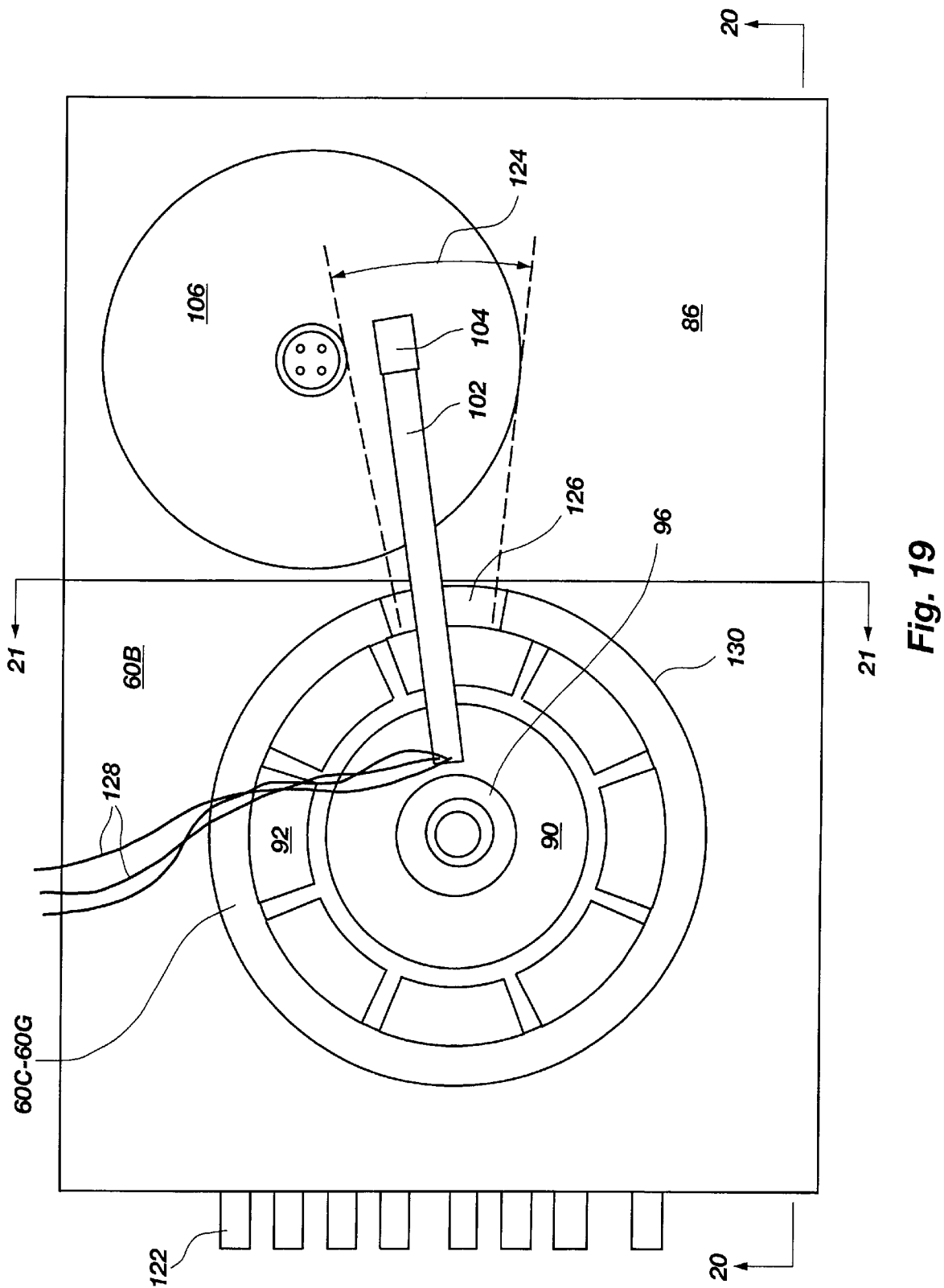
FIG. 19 is a top view of a micromachine comprising a disk drive/microactuator following stereolithographic formation of still further layers of a polymerized photopolymeric housing/support structure including an opening for a disk read/write head arm in accordance with the invention.
Figure 20:
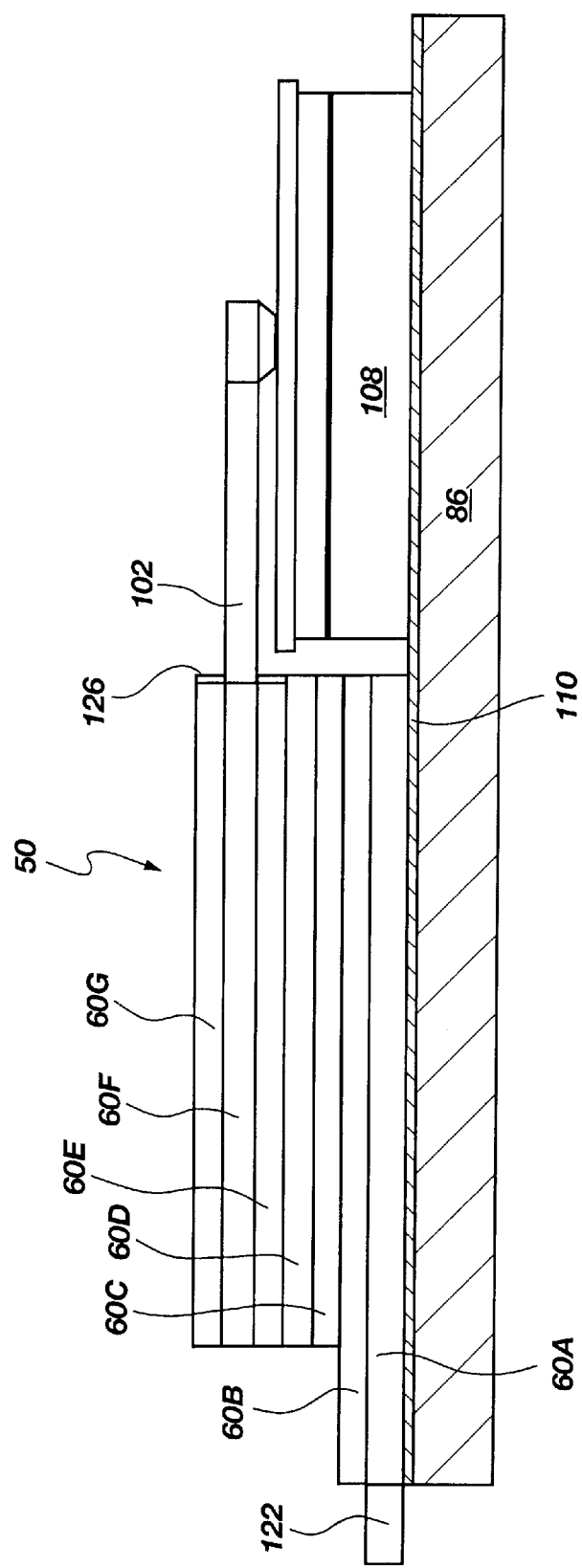
FIG. 20 is a cross-sectional side view of a micromachine comprising a disk drive/microactuator following stereolithographic formation of still further layers of a polymerized photopolymeric housing/support structure including an opening for a disk read/write head arm in accordance with the invention, as taken along line 20—20 of FIG. 19.
Figure 21:
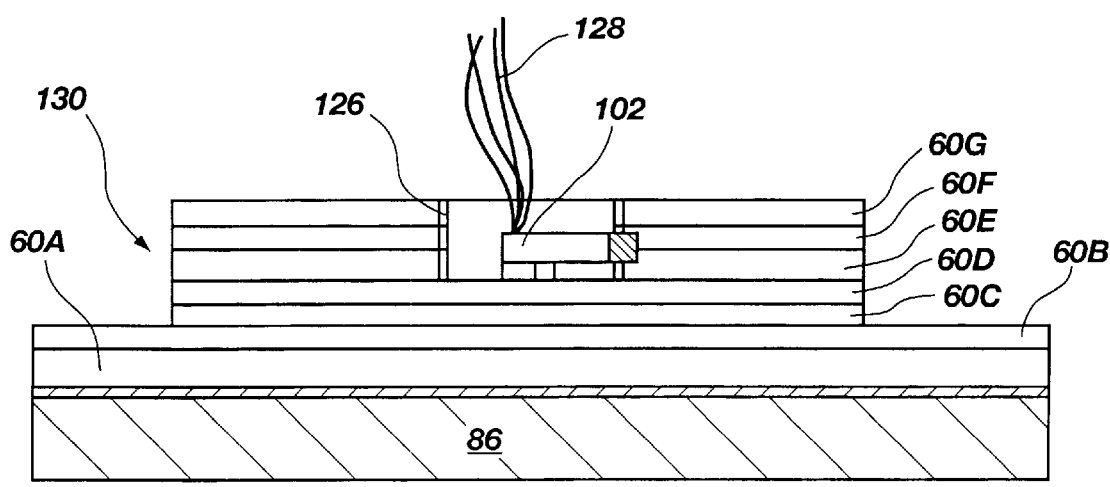
FIG. 21 is a cross-sectional end view of a micromachine comprising a disk drive/microactuator following stereolithographic formation of still further layers of a polymerized photopolymeric housing/support structure including an opening for a disk read/write head arm in accordance with the invention, as taken along line 21—21 of FIG. 19.

FIGS. 19, 20 and 21 show the formation of additional layers 60D, 60E, 60F and 60G atop the prior-formed layer 60C. Layers 60E, 60F and 60G are configured to leave an opening 126 in the object wall 130 through which the head arm 102 may move within angle 124 to read/write to disk 106.

Figure 22:
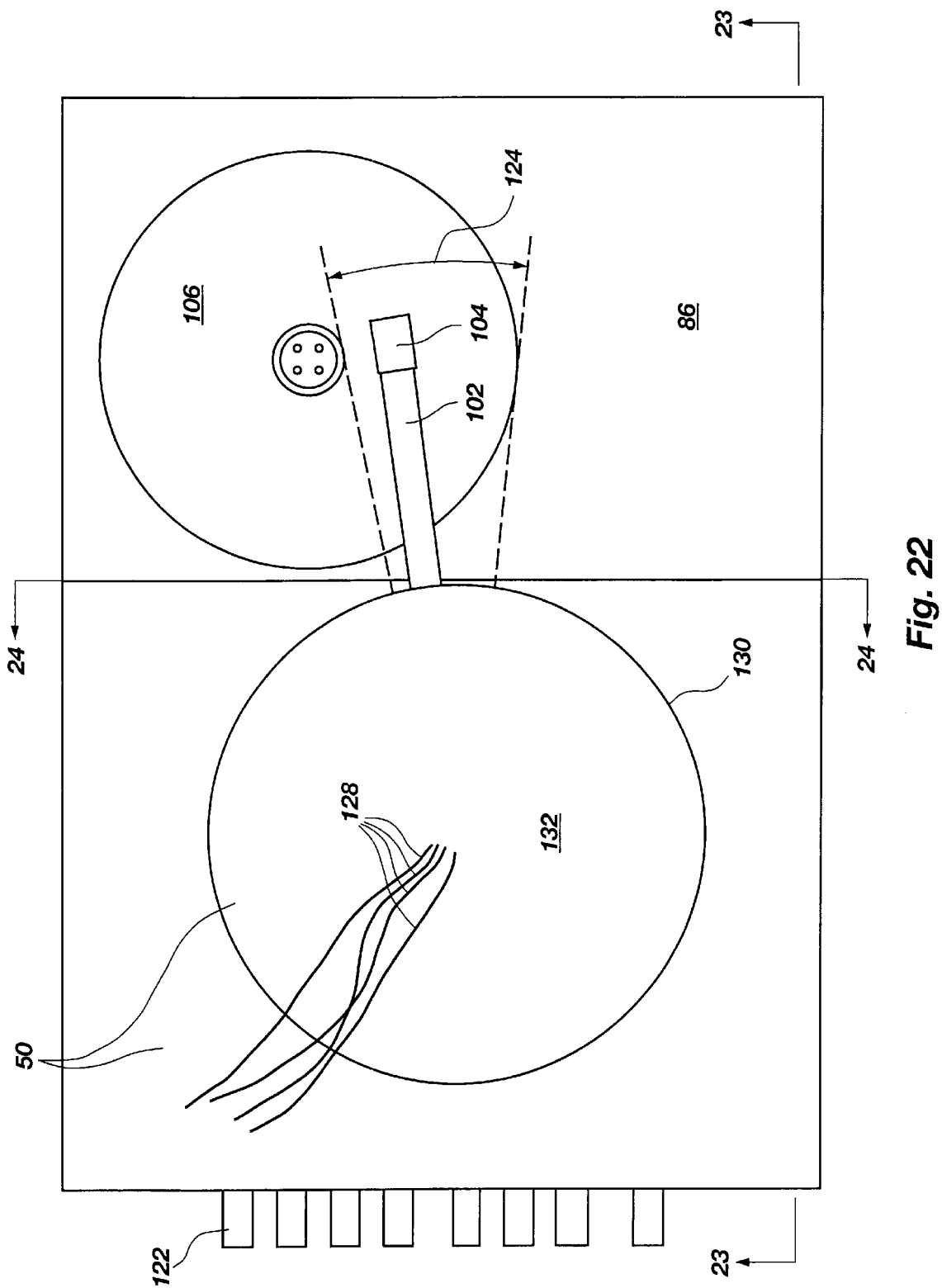
FIG. 22 is a top view of a micromachine comprising a disk drive/microactuator following stereolithographic formation of a final top layer of a polymerized photopolymeric housing/support structure about a micromotor/actuator in accordance with the invention.
Figure 23:
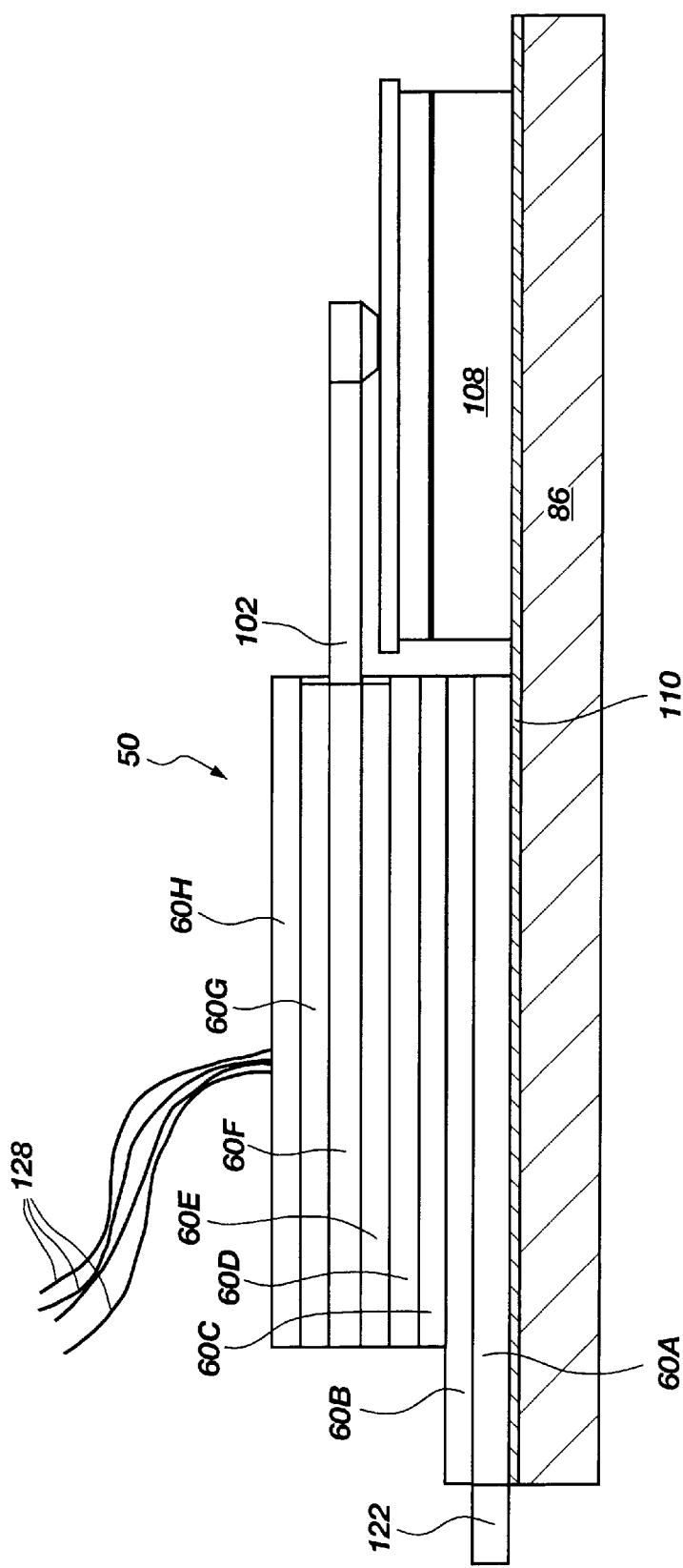
FIG. 23 is a cross-sectional side view of a micromachine comprising a disk drive/microactuator following stereolithographic formation of a final top layer of a polymerized photopolymeric housing/support structure about a micromotor/actuator in accordance with the invention, as taken along line 23—23 of FIG. 22.
Figure 24:
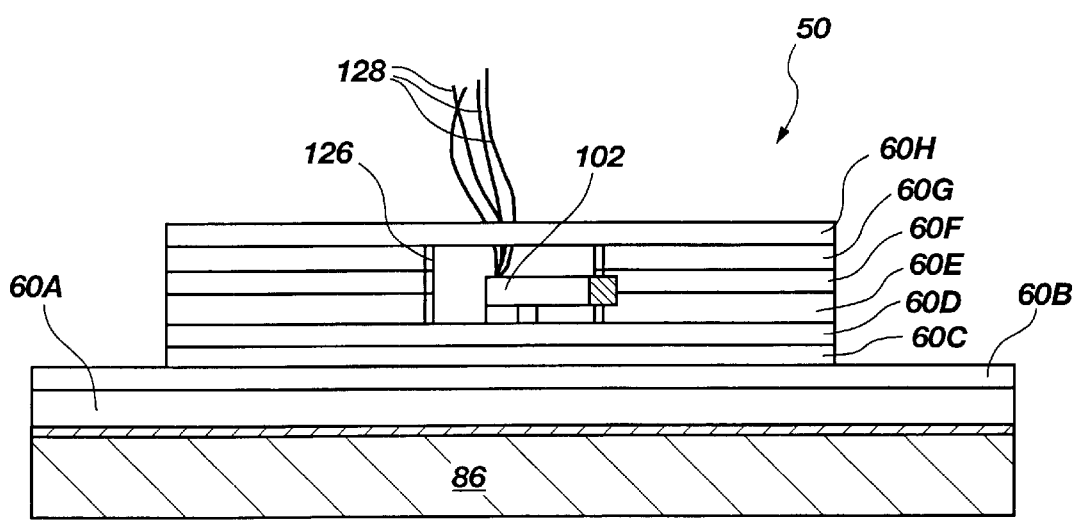
FIG. 24 is a cross-sectional end view of a micromachine comprising a disk drive/microactuator following stereolithographic formation of a final top layer of a polymerized photopolymeric housing/support structure about a micromotor/actuator in accordance with the invention, as taken along line 24—24 of FIG. 22.

As depicted in FIGS. 22 through 24, a next layer 60H is then formed as a cap 132 over the structure 50, enclosing the wobble micromotor 88 and a portion of the head arm 102. The cantilevered portion of layer 60H is preferably constructed by scanning the laser beam 28 over the region in sequential rapid scans, first forming a very thin "skin" and adding to the skin in subsequent scans. Read/write leads 128 may be placed to pass through the cap 132 or wall 130 of the object 50, and may be attached to a connector, not shown, for connection to read/write and other circuits. The read/write leads 128 are configured so that they do not apply any significant force on the rotor 90 as it turns through angle 124.

Figure 25:
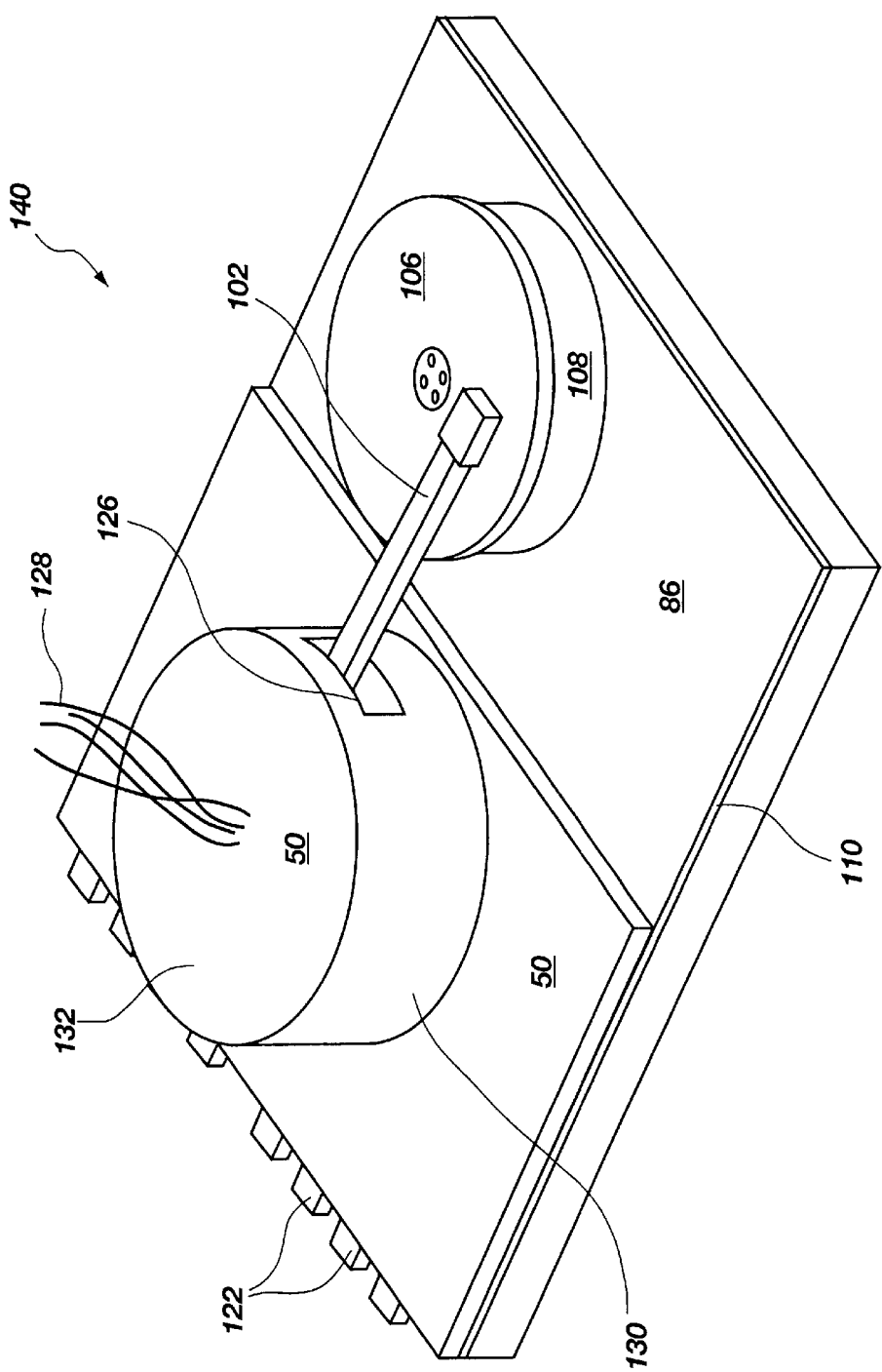
FIG. 25 is an upper isometric view of a micromachine comprising a disk drive/microactuator following stereolithographic formation of a housing/support structure about a micromotor/actuator, removal from a stereolithography machine, washing, and a final cure, in accordance with the invention.

Following the stereolithographic formation of as many layers 60 as are required to complete the object 50, the entire component 140, including wobble micromotor 88, disk drive assembly 100, object 50 and substrate 86, is removed from the reservoir 14 of liquid photopolymer material 16 (see FIG. 1) and excess liquid material 16 is washed from the component 140, utilizing the opening 126 to eliminate unpolymerized liquid material 16 from the wobble micromotor 88. The component 140 is removed from the support platform 20 and subjected to a fill cure such as by UV light exposure or thermal polymerization. The completed component appears as illustrated in FIG. 25. The object 50 comprises a unitary, seamless, monolithic structure with precise dimensions and smooth walls. The object 50 serves to prevent dust and moisture from easily entering the wobble micromotor 88 and protects it from damage during shipment, handling and installation. Elements passing from the wobble micromotor 88 to the outside through the object 50 include, in this example, metallized leads 118 terminating in outer lead ends 122, read/write leads 128, and a micro-actuator head arm 102. The leads 128 are sealed in the object 50. Leads 118 are sealed between the object 50 and underlying insulative layer 110.

Figure 26:
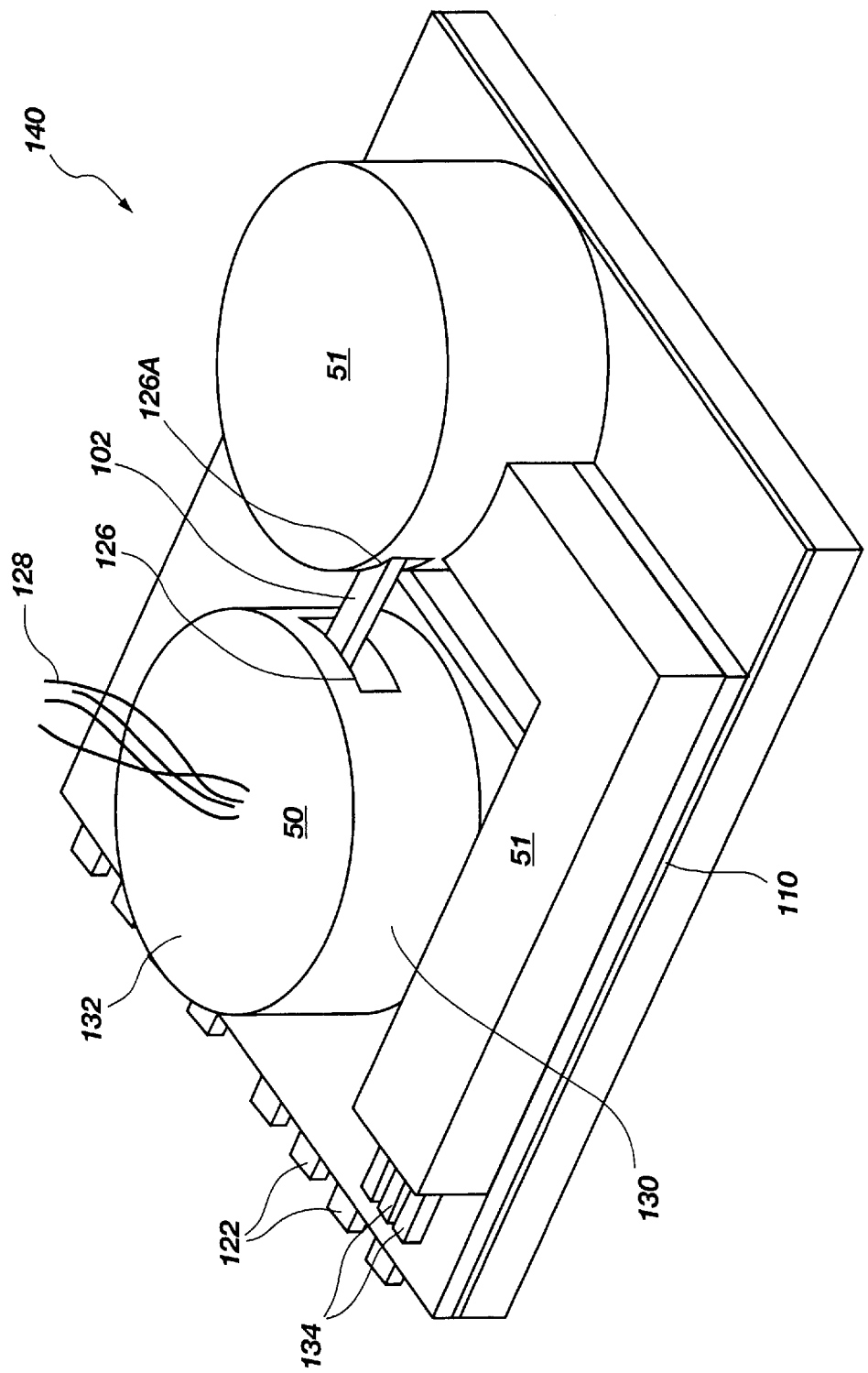
FIG. 26 is an upper isometric view of a micromachine comprising a disk drive/microactuator following stereolithographic formation of housing/support structures about a micromotor/actuator and a disk drive assembly, removal from a stereolithography machine, washing, and a final cure, in accordance with the invention.

FIG. 26 illustrates a further extension of the invention, wherein an object 51 comprising a further housing/support structure may be stereolithographically formed at the same time to enclose a second portion of the micromachine 40. As shown, a structure 51 is formed about the disk drive assembly 100 to enclose it. Structure 51 has an opening 126A through which the head arm 102 and read/write head 104 (not shown) project. An additional portion of structure 51 encloses the electrical leads 134 for powering the disk drive motor. It should be noted that each level 60A, 60B, 60C, etc. is stereolithographically formed for all objects in the component 140 in the same step, and the final cure is performed for all objects at one time. An advantage of this process is that a plurality of components 140 may be placed on a support platform 20 of the STL apparatus and processed together, saving substantial time.

Figure 27:
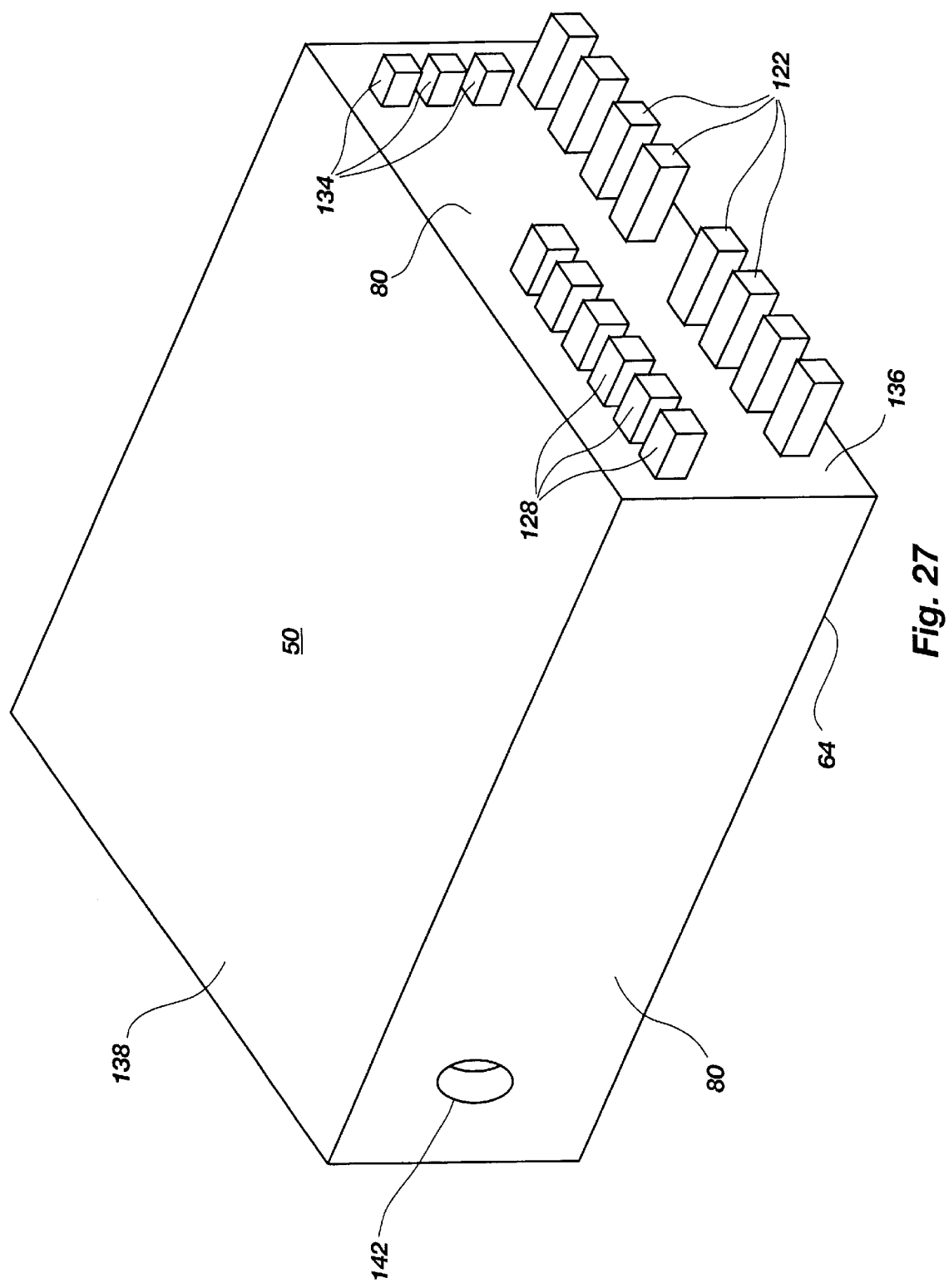
FIG. 27 is an upper isometric view of a micromachine comprising a disk drive/microactuator following stereolithographic formation of a housing/support structure encompassing the micromachine and having terminals of electrical conduits passing through said structure to the exterior thereof, removal from a stereolithography machine, washing, and a final cure, in accordance with the invention.

In another embodiment of this exemplary use of stereolithography, the entire component 140 is enclosed, including the substrate 86. FIG. 27 comprises a view of a completed modular housing/support object 50, in which all electrical connections pass through and are sealed by end wall 136 of the object. These electrical connections are depicted as including wobble micromotor lead outer ends 122, read/write leads 128 and disk drive motor electrical leads 134. The lower surface 64, external lateral wall surfaces 80 and cap surface 138 may be precisely formed to be very smooth.

To enable complete evacuation of unpolymerized liquid material 16 from the interior of the object 50 depicted in FIG. 27, an opening 142 is formed in each of at least two walls. If cooling is desired during operation, air may be passed over the object 50, or through the openings 142 to enhance heat transfer. If, on the other hand, a sealed enclosure is desired, the openings 142 may be closed. It will be understood and appreciated by those of ordinary skill in the art that such evacuation is required only when fabricating micromachines requiring internal voids to permit movement of elements therein, such as the movable components of the above-described disk drive assembly 100.

While the previously-described embodiments focus on the building of a housing or support structure from the bottom up, and then capping same, it will be recognized and appreciated that an upper portion or shell of a housing structure may be formed about a micromachine or a shell formed and a micromachine placed therein, the housing structure then being inverted and a bottom layer of polymerized photopolymer formed to produce a monolithic enclosure surrounding the micromachine. In short, the housing structure may be formed commencing in any suitable orientation, and completed in any suitable orientation.

The foregoing description concerns the formation of a monolithic housing/support for a micromachine such as a tape drive apparatus. The method of the invention is not to be interpreted as limited to this particular micromachine. The method is useful for forming housing/support apparatus for micromachines of many different designs, materials, and utility, including those not yet conceived. The only constraints are the ability to reach substantially all portions of each layer 60 with the laser beam 28 and the ability to remove all non-polymerized liquid material 16 from the interior of the object 50, if such would be deleterious. Of course, if an internal area of an object is to be solid but cannot be reached by laser beam 28, it need only be filled with trapped liquid polymer and subsequently thermally cured. Further, even if openings 142 are formed in the object 50 merely for the purpose of purging it of unpolymerized liquid material 16 following STL formation, the openings may be subsequently filled with a polymer to complete the sealed enclosure.

It is also contemplated that, based upon the teachings of the foregoing disclosure, the present invention may be used to form multi-component assemblies wherein a first portion of a housing is stereolithographically formed, a component or component assembly is then placed within the formed housing portion, a second portion of the housing is then formed and yet another component or component assembly is placed within the partially formed housing before the remainder of the housing is stereolithographically completed. Of course, the component assembly and housing formation process may proceed using as many steps as required to complete the device.

Thus, for example, a micromotor may be installed in a housing portion and sealed therein with power leads extending through a wall of the chamber stereolithographically "built around" the micromotor, after which a power supply such as a battery is placed in a formed portion of a second chamber into which the power leads extend, connected to the power leads, and then encapsulated. Another example would be the formation of a drive assembly including a motor having a rotary drive shaft extending therefrom. It may be desirable to support the extended end of the drive shaft with a bushing or a bearing assembly, which may be placed separately from the motor within the same partial housing fabricated according to the present invention. The motor and the bushing or bearing assembly may thus both be precisely placed, and then the housing completed. By way of example only, the present invention may be used to facilitate assembly of a miniaturized transmission or other drive train including a plurality of gears and shafts for increasing output shaft speed or output torque or providing a capability for gear ratio changes as well as reversal of shaft rotational directions, a drive train including a cam and an associated spring-loaded element or other linkage for converting rotational to reciprocating motion, or fabrication of a solenoid assembly with a preformed electromagnetic core, a spring and a shaft. Preformed metallic as well as nonmetallic components and assemblies thereof exhibiting desired structural, conductive, insulating or other characteristics may thus be incorporated into a seamless, multi-compartmented, multi-passage housing including internal partition walls (imperforate or including apertures therethrough) optimized for effective and efficient operation of any given device. The method of the present invention avoids the constraints of prior art molding technology, wherein convoluted, closed or almost closed chambers are difficult to form, and component installation difficulties often necessitate that two, three or even more sections of housing be assembled and bonded or otherwise fastened together. It will be appreciated that manipulating and bonding multi-section housings for miniature component assemblies is a difficult and often impossible task, thus precluding the fabrication of some such assemblies altogether.

The STL process employed in the present invention is conducted essentially at room temperature, eliminating one of the problems in conventional microconstruction, i.e., thermal stress. The method is also extremely frugal in its use of dielectric photopolymer, since essentially the only polymer which is consumed is that which forms the object 50.

Post-cure of objects 50 formed according to the present invention may be effected with broad-source UV radiation emanating from, for example, flood lights in a chamber through which dice are moved on a conveyor, or in large batches. Additionally, if some portion of an object 50 is shadowed by another portion thereof, cure of liquid material 16 in that area may be completed in an oven at a relatively low temperature such as, for example, 160 degrees C.

The present invention has been described herein specifically with respect to micromachines and the fabrication of housings therefor. However, those of ordinary skill in the art will recognize the present invention's applicability to the fabrication of housings and support structures for larger multi-component structures, as desired.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of fabricating a housing structure for a micromachine, said method comprising:

providing a micromachine including a plurality of components; and fabricating a housing structure at least about an exterior of said micromachine in the form of at least two superimposed, contiguous, mutually adhered layers of photopolymer polymerized in place, including fabricating at least a portion of said housing structure in spaced relationship to said micromachine.

2. The method of claim 1, further including joining said housing structure to said micromachine.

3. The method of claim 1, further comprising forming a top layer of polymerized photopolymer adhered to said housing structure and overlying said micromachine.

4. The method of claim 1 wherein fabricating at least a portion of said housing structure in spaced relationship to said micromachine includes forming at least a portion of a top layer of polymerized photopolymer spaced from and cantilevered over said micromachine.

5. The method of claim 1, further comprising inverting said housing structure and micromachine and forming a bottom layer of polymerized photopolymer to produce a monolithic enclosure surrounding said micromachine.

6. The method of claim 1, further comprising forming each of said at least two layers by polymerizing laser radiation controllably scanned over a thin film of liquid photopolymer material.

7. The method of claim 1, further including fabricating said housing structure as one of a plurality of housing structures formed substantially concurrently over a respective plurality of micromachines disposed on a support platform.

8. A method of fabricating a housing structure for a micromachine, said method comprising:

providing a micromachine including a plurality of components; and fabricating a housing structure at least about an exterior of said micromachine in the form of at least two superimposed, contiguous, mutually adhered layers of photopolymer polymerized in place, further including configuring said micromachine to include a micromotor for actuating a movable component which interacts with an element exterior to said micromachine and forming said housing structure about said movable component to define and configure an aperture about a portion of said movable component extending therethrough to accommodate movement of said movable component.

9. The method of claim 1, further comprising fabricating at least one interior partition of said housing structure.

10. The method of claim 1, further comprising forming a portion of said housing structure, placing said micromachine within said portion, and forming at least another portion of said housing structure.

11. The method of claim 10, further comprising forming a portion of said housing structure, placing at least one component of the micromachine within the portion, forming another portion of said housing structure, and placing at least another component of the micromachine within said another portion of said housing structure.

12. A method of forming a housing structure for a micromachine, comprising:

providing a micromachine having at least one movable component extending from an exterior thereof;

forming at least one layer of polymerized photopolymer;

placing said micromachine on at least a portion of said at least one layer of polymerized photopolymer;

forming a border comprising at least one additional layer of polymerized photopolymer about a periphery of said micromachine to the exclusion of a protrusion beyond said border of said at least one movable component; and forming at least another additional layer of polymerized photopolymer proximate to but spaced from said micromachine.

13. The method of claim 12, wherein said at least one additional layer is placed over at least a portion of said micromachine to fix said micromachine in a desired position on an upper surface of said at least one layer of polymerized photopolymer.

14. The method of claim 12, wherein said micromachine includes electrical conductors for connection with apparatus exterior to said micromachine, and further comprising the steps of:

placing said electrical conductors across a formed layer of polymerized photopolymer of said border to extend to a location exterior of said border; and forming at least one additional layer of polymerized photopolymer over a prior formed layer of said border and said electrical conductors to encompass passage of said electrical conductors through said border.

15. The method of claim 12, further comprising forming a layer of polymerized photopolymer adhered to a portion of said housing structure and overlying said micromachine.

16. The method of claim 12, wherein forming at least another additional layer of polymerized photopolymer proximate to but spaced from said micromachine comprises forming said at least another additional layer overlying said micromachine to cause at least a portion of said layer to be spaced from and cantilevered over at least a portion of said micromachine.

17. The method of claim 12, further including forming said layers of polymerized photopolymer using polymerizing laser radiation controllably scanned over a thin film of liquid photopolymer material.

18. The method of claim 12, further including fabricating said housing structure as one of a plurality of housing structures formed substantially concurrently over a respective plurality of micromachines disposed on a support platform.

19. The method of claim 12, further including configuring said micromachine to include a micromotor for actuating said at least one movable component.

20. The method of claim 12, further comprising storing data including at least some dimensions of said micromachine and desired boundaries for said housing structure in computer memory, and using the stored data in conjunction with a machine vision system to recognize a location and orientation of said micromachine and to direct formation of said housing structure in accordance with said desired boundaries.

21. The method of claim 20, further comprising using the stored data, in conjunction with said machine vision system, to stereolithographically form a plurality of layers of polymerized photopolymer.

22. A method of constructing a housing structure for a micromachine having at least one movable element protruding therefrom, said method comprising:

(a) providing at least one micromachine having at least one movable element protruding therefrom;

(b) providing a stereolithography apparatus having a reservoir for holding a liquid photopolymer material, a support platform movable vertically in said liquid photopolymer material, and a laser source for generating a laser beam scannable over said support platform under control of a computer program;

(c) submerging said support platform with said at least one micromachine in said liquid photopolymer material to form a thin film thereof on said support platform;

(d) scanning said laser beam over selected portions of said thin film adjacent said at least one micromachine to polymerize the thin film in said selected portions to at least a semisolid state; and (e) iterating steps (c) and (d) to produce a stack of superimposed, contiguous, mutually adhered, at least semisolid layers of polymeric material, wherein said scanning excludes portions of said thin film corresponding to a location of at least one opening in at least one layer of said stack of at least semisolid layers of polymeric material through which said at least one movable element protrudes and over which at least one opening another at least semisolid layer of polymeric material extends to define an upper boundary therefor.

23. The method of claim 22, wherein said at least one micromachine includes electrical conductors extending therefrom and wherein said electrical conductors are placed across said at least semisolid layers of polymeric material, and a subsequent at least semisolid layer of polymeric material is formed thereover to embed and seal said electrical conductors within said housing structure.

24. A method for fabricating a micromachine, comprising:

forming a first portion of a housing structure;

placing a first preformed machine element of a micromachine on the first portion of the housing structure;

forming a second portion of the housing structure adjacent the first machine element of the micromachine;

placing a second preformed machine element of the micromachine in operably coupled relationship to the first machine element of the micromachine; and forming at least a third portion of the housing structure to encompass at least portions of the first and second machine elements.

25. The method of claim 24, further comprising providing at least one of the first and second machine elements as an assembly of preformed components.

26. The method of claim 24, further comprising forming the housing structure with at least one aperture through a wall thereof to accommodate extension of at least one portion of at least one of the first and second machine elements therethrough.

27. The method of claim 24, further comprising forming a partition wall within the housing structure through which a third machine element extends to effect the operably coupled relationship of the first and second machine elements.

28. The method of claim 27, wherein the third machine element comprises at least one electrical conductor, and further comprising forming the partition wall about the at least one electrical conductor.

29. The method of claim 27, further comprising pre-placing the third machine element between the first and second machine elements and forming the partition wall thereafter with an aperture through which the third machine element extends in a spaced relationship to a border of the aperture.

30. The method of claim 24, wherein placing the second machine element comprises extending a portion of the second machine element through an aperture in the first machine element.

* * * * *

UNITED STATES PATENT AND TRADEMARK OFFICE
CERTIFICATE OF CORRECTION

PATENT NO. : 6,562,278 B1  
APPLICATION NO. : 09/651863  
DATED : May 13, 2003  
INVENTOR(S) : Warren M. Farnworth and Kevin G. Duesman Page 1 of 1

It is certified that error appears in the above-identified patent and that said Letters Patent is hereby corrected as shown below:

In the specification:

| | | |
|---|---|---|
| COLUMN 1, | LINES 11-12, | change "electro mechanical" to --electromechanical-- |
| COLUMN 1, | LINE 23, | change "3D" to --3-D-- |
| COLUMN 3, | LINE 15, | change "3D" to --3-D-- |
| COLUMN 6, | LINE 45, | change "3D" to --3-D-- |
| COLUMN 7, | LINE 39, | change "3D" to --3-D-- |
| COLUMN 11, | LINE 6, | change "008" to --0.008-- |
| COLUMN 12, | LINE 19, | change "Chemical Company" to --Chemicals Inc.-- |
| COLUMN 14, | LINE 14, | change "fill" to --full-- |
| COLUMN 14, | LINE 29, | after "object" and before "51" insert --or structure-- |

Signed and Sealed this  
Twenty-fourth Day of December, 2013

Margaret A. Focarino  
*Commissioner for Patents of the United States Patent and Trademark Office*